(12) United States Patent
Jung et al.

(10) Patent No.: US 11,735,109 B2
(45) Date of Patent: Aug. 22, 2023

(54) DISPLAY PANEL AND DISPLAY DEVICE USING THE SAME

(71) Applicant: LG Display Co., Ltd., Seoul (KR)

(72) Inventors: Bo Yun Jung, Paju-si (KR); Bo Gun Seo, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/474,809

(22) Filed: Sep. 14, 2021

(65) Prior Publication Data

US 2022/0122535 A1 Apr. 21, 2022

(30) Foreign Application Priority Data

Oct. 19, 2020 (KR) .................. 10-2020-0135234

(51) Int. Cl.
| | |
|---|---|
| *G09G 3/3233* | (2016.01) |
| *G09G 3/3275* | (2016.01) |
| *H10K 59/65* | (2023.01) |
| *H10K 59/131* | (2023.01) |
| *H10K 59/121* | (2023.01) |
| *H01L 29/786* | (2006.01) |
| *G09G 3/3266* | (2016.01) |
| *H01L 27/12* | (2006.01) |

(52) U.S. Cl.
CPC ......... *G09G 3/3233* (2013.01); *G09G 3/3275* (2013.01); *H10K 59/1213* (2023.02); *H10K 59/131* (2023.02); *H10K 59/65* (2023.02); *G09G 3/3266* (2013.01); *G09G 2300/0426* (2013.01); *G09G 2300/0452* (2013.01); *G09G 2300/0842* (2013.01); *G09G 2310/027* (2013.01); *G09G 2310/0221* (2013.01); *G09G 2330/02* (2013.01); *H01L 27/1222* (2013.01); *H01L 29/78696* (2013.01)

(58) Field of Classification Search
CPC .. G09G 3/3233; G09G 3/3275; G09G 3/3266; G09G 2300/0426; G09G 2300/0452; G09G 2300/0842; G09G 2310/0221; G09G 2310/027; G09G 2330/02; H01L 27/3234; H01L 27/3262; H01L 27/3276; H01L 29/78696
See application file for complete search history.

(56) References Cited

U.S. PATENT DOCUMENTS

| | | | |
|---|---|---|---|
| 2018/0018917 A1* | 1/2018 | Yoo | ...................... G09G 3/3275 |
| 2019/0310724 A1* | 10/2019 | Yeke Yazdandoost | ...................... H01L 27/3211 |

FOREIGN PATENT DOCUMENTS

CN 110444125 A * 11/2019 ............... G09F 9/33

* cited by examiner

*Primary Examiner* — Kenneth B Lee, Jr.
(74) *Attorney, Agent, or Firm* — Seed IP Law Group LLP

(57) ABSTRACT

The present disclosure relates to a display panel and a display device using the same, and includes a first region where pixels are disposed, and a second region where pixels having a lower pixel density (pixels per inch: PPI) compared to the first region are disposed. Each of the pixels of the first region includes a first pixel circuit. Each of the pixels of the second region includes a second pixel circuit. The second pixel circuit includes fewer transistors compared to the first pixel circuit.

14 Claims, 17 Drawing Sheets

DISPLAY PANEL AND DISPLAY DEVICE USING THE SAME

CROSS-REFERENCE TO RELATED APPLICATION

This application claims priority to and the benefit of Korean Patent Application No. 10-2020-0135234, filed on Oct. 19, 2020, the disclosure of which is incorporated herein by reference in its entirety.

BACKGROUND

Technical Field

The present disclosure relates to a display panel with partially different resolutions or pixels per inch (PPI) and a display device using the same.

Description of the Related Art

An electroluminescent display device is roughly classified as an inorganic light emitting display device or an organic light emitting display device according to a material of a light emitting layer. An active-matrix type organic light emitting display device includes an organic light emitting diode (hereinafter referred to as "OLED") which emits light by itself, and has advantages of a quick response time, high luminous efficiency, high luminance, and a wide viewing angle. In the organic light emitting display device, the OLED is formed in each of the pixels. Since the organic light emitting display device not only has a quick response time and excellent luminous efficiency, luminance, and viewing angle, but also can express a black grayscale as perfect black, a contrast ratio and color gamut are excellent.

The multimedia functions of mobile terminals are improving. For example, a camera is built into a smart phone by default, and the resolution of the camera is increasing to a level of a conventional digital camera. A front camera of a smart phone restricts a screen design, making it difficult to design a screen. In order to reduce a space occupied by the camera, the screen design including a notch or punch hole has been adopted in smart phones, but since a screen size is still limited due to the camera, a full-screen display cannot be implemented.

BRIEF SUMMARY

In order to implement a full-screen display, a camera module may be disposed to overlap a screen of a display panel. In order to increase the quality of an image obtained by the camera module, transmittance of the display panel overlapping the camera module should be increased, but it is difficult to design for improving the transmittance due to pixel circuits and lines.

One or more embodiments of the present disclosure solve the above-mentioned needs as well as other problems in the related art.

The present disclosure is directed to providing a display panel capable of implementing a full-screen display and increasing the transmittance of the display panel in a sensing region where light is received, and a display device using the same According to an aspect of the present disclosure, there is provided a display panel including a first region where pixels are disposed, and a second region where pixels having a lower pixel density (pixels per inch: PPI) compared to the first region are disposed.

Each of the pixels of the first region may include a first pixel circuit. Each of the pixels of the second region may include a second pixel circuit. The second pixel circuit may include fewer transistors compared to the first pixel circuit.

According to another aspect of the present disclosure, there is provided a display device including a display panel including a first region where pixels are disposed, a second region where pixels having a lower pixel density (pixels per inch: PPI) compared to the first region are disposed, a first gate driving part configured to drive gate lines of the first region, and a second gate driving part configured to drive gate lines of the second region, a first data driving part configured to supply a data voltage to data lines of the first region, and a second data driving part configured to supply a data voltage to data lines of the second region.

BRIEF DESCRIPTION OF THE SEVERAL VIEWS OF THE DRAWINGS

The above and other features and advantages of the present disclosure will become more apparent to those of ordinary skill in the art by describing in detail embodiments thereof with reference to the accompanying drawings, in which.

DETAILED DESCRIPTION

Figure 1:
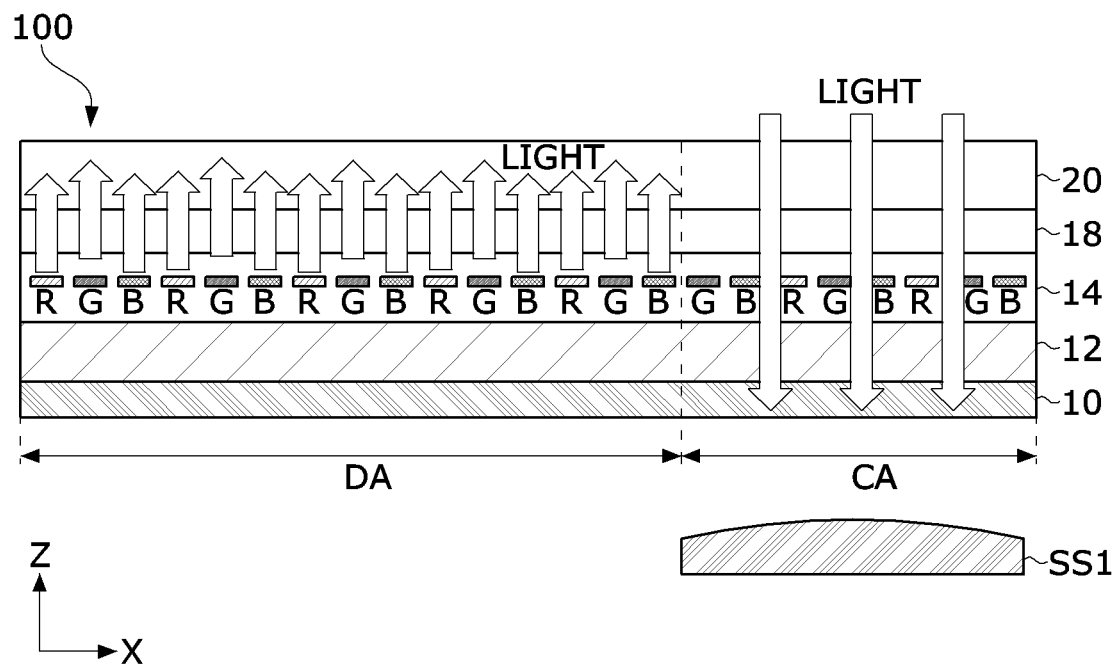
FIG. 1 is a cross-sectional view schematically illustrating a display panel according to an embodiment of the present disclosure.

The advantages and features of the present disclosure and methods for accomplishing the same will be more clearly understood from embodiments described below with reference to the accompanying drawings. However, the present disclosure is not limited to the following embodiments but may be implemented in various different forms. Rather, the present embodiments will make the disclosure of the present disclosure complete and allow those skilled in the art to completely comprehend the scope of the present disclosure.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the present specification. Further, in describing the present disclosure, detailed descriptions of known related technologies may be omitted to avoid unnecessarily obscuring the subject matter of the present disclosure.

The terms such as "comprising," "including," "having," used herein are generally intended to allow other components to be added unless the terms are used with the term "only." Any references to singular may include plural unless expressly stated otherwise.

Components are interpreted to include an ordinary error range even if not expressly stated.

When the position relation between two components is described using the terms such as "on," "above," "below," and "next," one or more components may be positioned between the two components unless the terms are used with the term "immediately" or "directly."

The terms "first," "second," and the like may be used to distinguish components from each other, but the functions or structures of the components are not limited by ordinal numbers or component names in front of the components.

The term "part" may include any electrical circuitry, features, components, an assembly of electronic components or the like. In some embodiments, the various parts described herein may be included in or otherwise implemented by processing circuitry such as a microprocessor, microcontroller, or the like.

The same reference numerals may refer to substantially the same elements throughout the present disclosure.

The following embodiments can be partially or entirely bonded to or combined with each other and can be linked and operated in technically various ways. The embodiments can be carried out independently of or in association with each other.

In a display device of the present disclosure, a pixel circuit may include at least one of an n-channel transistor and a p-channel transistor. Transistors may be implemented as oxide thin film transistors (oxide TFTs) including an oxide semiconductor, low temperature polysilicon (LTPS) TFTs including low temperature polysilicon, or the like. Further, each of the transistors may be implemented as a p-channel TFT or an n-channel TFT. In embodiments, descriptions will be given based on an example in which the transistors of the pixel circuit are implemented as the p-channel TFTs, but the present disclosure is not limited thereto.

A transistor is a three-electrode element including a gate, a source, and a drain. The source is an electrode that supplies carriers to the transistor. In the transistor, carriers start to flow from the source. The drain is an electrode through which carriers exit from the transistor. In a transistor, carriers flow from a source to a drain. In the case of an n-channel transistor, since carriers are electrons, a source voltage is a voltage lower than a drain voltage such that electrons may flow from a source to a drain. The n-channel transistor has a direction of a current flowing from the drain to the source. In the case of a p-channel transistor (p-channel metal-oxide semiconductor (PMOS)), since carriers are holes, a source voltage is higher than a drain voltage such that holes may flow from a source to a drain. In the p-channel transistor, since holes flow from the source to the drain, a current flows from the source to the drain. It should be noted that a source and a drain of a transistor are not fixed. For example, a source and a drain may be changed according to an applied voltage. Therefore, the disclosure is not limited due to a source and a drain of a transistor. In the following description, a source and a drain of a transistor will be referred to as a first electrode and a second electrode.

A gate signal swings between a gate-on voltage and a gate-off voltage. The gate-on voltage is set to a voltage higher than a threshold voltage of a transistor, and the gate-off voltage is set to a voltage lower than the threshold voltage of the transistor. A transistor is turned on in response to a gate-on voltage and is turned off in response to a gate-off voltage. In the case of an n-channel transistor, a gate-on voltage may be a gate high voltage VGH and VEH, and a gate-off voltage may be a gate low voltage VGL and VEL. In the case of a p-channel transistor, a gate-on voltage may be the gate low voltage VGL and VEL, and a gate-off voltage may be the gate high voltage VGH and VEH.

Hereinafter, various embodiments of the present disclosure will be described in detail with reference to the accompanying drawings.

Figure 2:
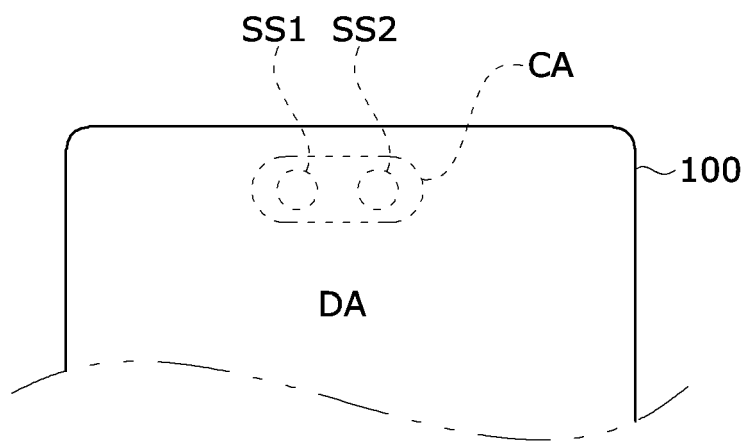
FIG. 2 is a plan view illustrating a region in a screen of the display panel where a sensor module is disposed.

Referring to FIGS. 1 and 2, a display panel 100 includes a screen which reproduces an input image. The screen may be divided into first and second regions DA and CA having different resolutions.

Each of the first region DA and the second region CA includes a pixel array where pixels to which pixel data of an input image is written are disposed. The first region DA is a main display region which occupies most of the screen. The second region CA is a sensing region where the pixels are disposed at a lower pixel density (pixels per inch: PPI) compared to the first region DA.

As shown in FIG. 2, one or more sensor modules SS1 and SS2 facing the second region CA may be disposed under the display panel 100. For example, various sensors such as an imaging module (or camera module) including an image sensor, an infrared sensor module, an illuminance sensor module, and the like may be disposed under the second region CA of the display panel 100. The second region CA may include light transmitting parts to increase transmittance of light directed to the sensor modules.

Since the first region DA and the second region CA include pixels, the input image may be displayed in the first region DA and the second region CA.

Each of the pixels of the first region DA and the second region CA includes sub-pixels having different colors to realize a color of an image. The sub-pixels include a red sub-pixel (hereinafter referred to as "an R sub-pixel"), a green sub-pixel (hereinafter referred to as "a G sub-pixel"), and a blue sub-pixel (hereinafter referred to as "a B sub-pixel"). Although not shown, each of the pixels P may further include a white sub-pixel (hereinafter referred to as "a W sub-pixel"). Each of the sub-pixels may include a pixel circuit which drives a light emitting element.

An image quality compensation algorithm for compensating for luminance and color coordinates of the pixels of the second region CA having a lower PPI compared to the first region DA may be applied In a display device of the present disclosure, since the pixels are disposed in the second region CA where a sensor is disposed, the display region of the screen is not limited due to the sensor module. Accordingly, the display device of the present disclosure may implement a screen of a full-screen display The display panel 100 has a width in an X-axis direction, a length in a Y-axis direction, and a thickness in a Z-axis direction. The display panel 100 may include a circuit layer 12 disposed on a substrate, and a light emitting element layer 14 disposed on the circuit layer 12. A polarizing plate 18 may be disposed on the light emitting element layer 14, and a cover glass 20 may be disposed on the polarizing plate 18.

The circuit layer 12 may include a pixel circuit connected to lines such as data lines, gate lines, power lines, and the like and a gate driving circuit (also referred to as a gate driving part) connected to the gate lines. The circuit layer 12 may include circuit elements such as transistors implemented with thin film transistors (TFT), a capacitor, and the like. The lines and circuit elements of the circuit layer 12 may be implemented with a plurality of insulating layers, two or more metal layers spaced apart from each other with an insulating layer therebetween, and an active layer including a semiconductor material.

The light emitting element layer 14 may include a light emitting element driven by the pixel circuit. The light emitting element may be implemented with an organic light emitting diode (OLED). The OLED includes an organic compound layer formed between an anode and a cathode. The organic compound layer may include a hole injection layer (HIL), a hole transport layer (HTL), an emission layer (EML), an electron transport layer (ETL), and an electron injection layer (EIL), but the present disclosure is not limited thereto. When a voltage is applied to the anode and the cathode of the OLED, holes passing through the hole transport layer (HTL) and electrons passing through the electron transport layer (ETL) move to the emission layer (EML) and then form excitons, and thus visible light is emitted from the emission layer (EML). The light emitting element layer 14 may be disposed on pixels which selectively transmit red, green, and blue wavelengths, and may further include a color filter array.

The light emitting element layer 14 may be covered by a protective film, and the protective film may be covered by an encapsulation layer. The protective film and the encapsulation layer may have a structure in which organic films and inorganic films are alternately stacked. The inorganic film blocks the penetration of moisture or oxygen. The organic film flattens the surface of the inorganic film. When the organic films and the inorganic films are stacked in multiple layers, since a movement passage of moisture or oxygen is longer than that of a single layer, the penetration of moisture or oxygen which affects the light emitting element layer 14 may be effectively blocked.

The polarizing plate 18 may be attached to the encapsulation layer. The polarizing plate 18 improves outdoor visibility of the display device. The polarizing plate 18 reduces light reflected from a surface of the display panel 100 and blocks light reflected from the metal of the circuit layer 12 to improve the brightness of pixels. The polarizing plate 18 may be implemented with a circular polarizing plate or a polarizing plate in which a linear polarizing plate and a phase retardation film are bonded.

Figure 3:
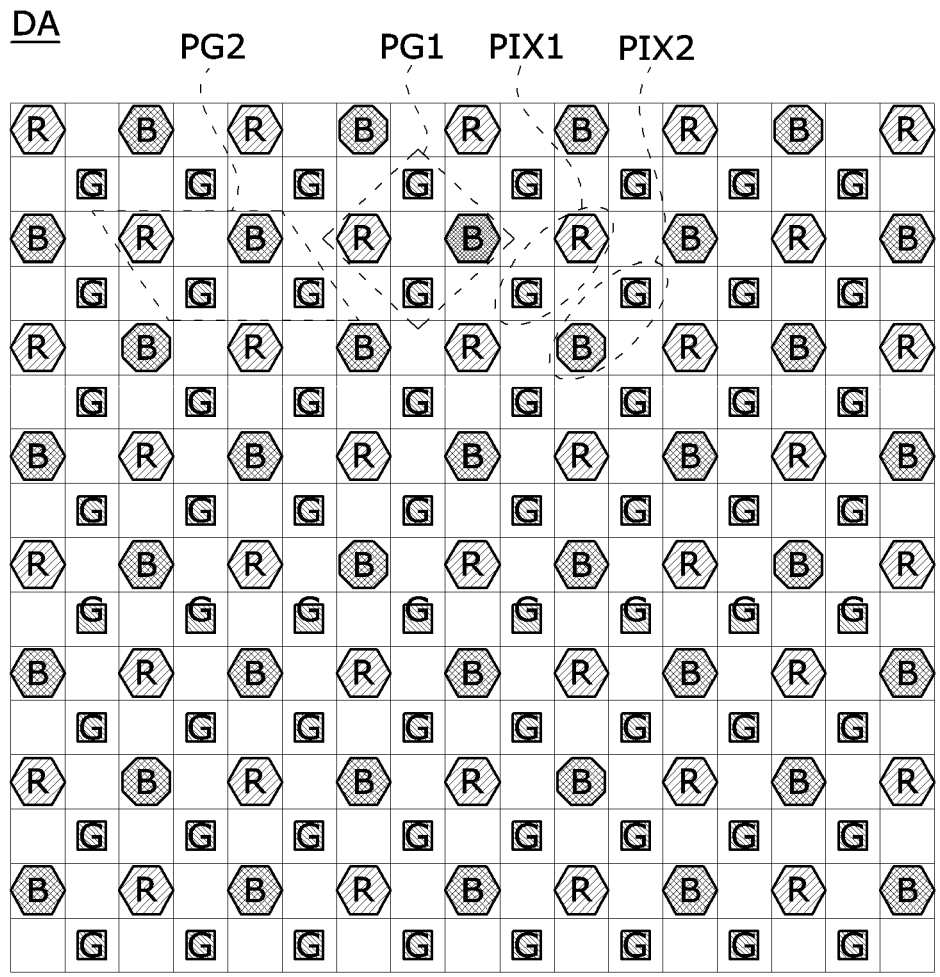
FIG. 3 is a view illustrating the pixel disposition of a first region.
Figure 4:
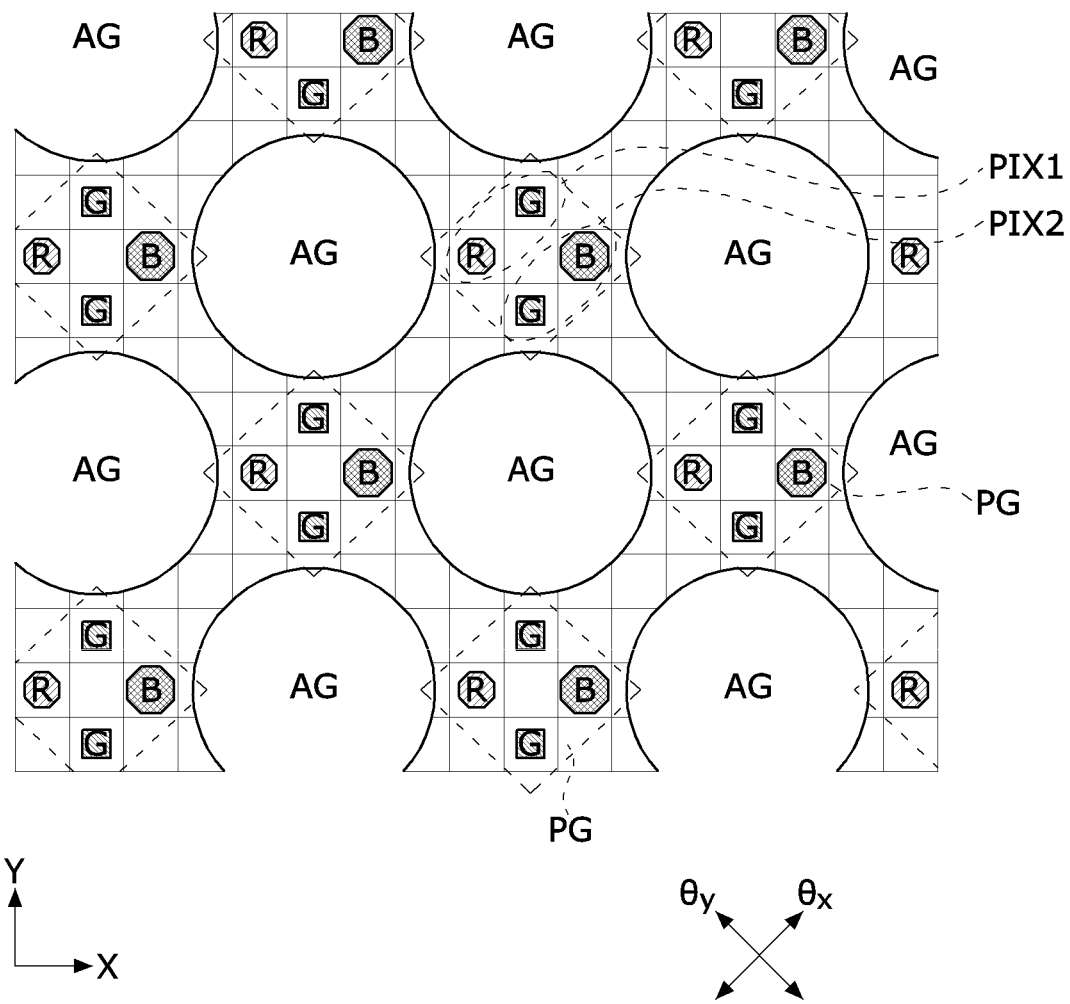
FIG. 4 is a view illustrating the pixel disposition of a second region.

FIG. 3 is a view illustrating the pixel disposition of the first region DA. FIG. 4 is a view illustrating an example of pixels and light transmitting parts of the second region CA. Lines connected to the pixels in FIGS. 3 and 4 are omitted.

Referring to FIG. 3, the first region DA includes pixels PIX1 and PIX2 which are arranged at high PPIs. Each of the pixels PIX1 and PIX2 may be implemented as a real-type pixel in which R, G, and B sub-pixels of the three primary colors are configured as one pixel. Each of the pixels PIX1 and PIX2 may further include a W sub-pixel that is omitted in the drawing.

In each of the pixels, two sub-pixels may be configured as one pixel using a sub-pixel rendering algorithm. For example, a first pixel PIX1 may be composed of R and first G sub-pixels, and a second pixel PIX2 may be composed of B and second G sub-pixels. Insufficient color representation in each of the first and second pixels PIX1 and PIX2 may be compensated for by an average value of corresponding color data between neighboring pixels.

The pixels of the first region DA may be defined as unit pixel groups PG1 and PG2 each having a predetermined (or selected) size. The unit pixel groups PG1 and PG2 are pixel regions each having a predetermined (or selected) size and including four sub-pixels. The unit pixel groups PG1 and PG2 repeat in a first direction (X axis), a second direction (Y axis) perpendicular to the first direction, and inclination angle directions (θx and θy axes) between the first and second directions. θx and θy respectively represent inclined axis directions in which the X-axis and Y-axis are rotated by 45°.

The unit pixel groups PG1 and PG2 may be a parallelogram-shaped pixel region PG1 or a rhombus-shaped pixel region PG2. The unit pixel groups PG1 and PG2 should be interpreted as including a rectangular shape, a square shape, and the like.

The sub-pixels of the unit pixel groups PG1 and PG2 include a sub-pixel of a first color, a sub-pixel of a second color, and a sub-pixel of a third color, and one of the sub-pixels of the first to third colors is two sub-pixels. For example, the unit pixel groups PG1 and PG2 may include one R sub-pixel, two G sub-pixels, and one B sub-pixel. The sub-pixels in the unit pixel groups PG1 and PG2 may have a different luminous efficiency of the light emitting element for each color. In consideration of this, sizes of the sub-pixels may vary for each color. For example, the B sub-pixel may be the largest and the G sub-pixel may be the smallest among the R, G, and B sub-pixels.

Referring to FIG. 4, the second region CA includes pixel groups PG spaced a predetermined (or selected) distance from one another, and light transmitting parts AG disposed between neighboring pixel groups PG. External light is received by a lens of the sensor module through the light transmitting parts AG. The light transmitting parts AG may include transparent media having high transmittance without a metal so that the light may be incident with minimal light loss. In other words, the light transmitting parts AG may be formed of transparent insulating materials without including metal lines or pixels. The PPI of the second region CA becomes lower than that of the first region DA due to the light transmitting parts AG.

The pixel group PG of the second region CA may include one or two pixels. Each of the pixels of the pixel group may include two to four sub-pixels. For example, one pixel in the pixel group may include the R, G, and B sub-pixels or may include two sub-pixels, and may further include a W sub-pixel. In the example in FIG. 4, the first pixel PIX1 is composed of R and G sub-pixels, and the second pixel PIX2 is composed of B and G sub-pixels, but the present disclosure is not limited thereto.

A shape of each of the light transmitting parts AG is illustrated as a circular shape in FIG. 4, but is not limited thereto. For example, the light transmitting parts AG may be designed in various shapes such as a circular shape, an oval shape, a polygonal shape, and the like.

Due to a process variation and an element characteristic variation caused in a manufacturing process of the display panel, there may be a difference in electrical characteristics of the driving element between the pixels, and this difference may increase as a driving time of the pixels elapses. In order to compensate for the electrical characteristic variations of the driving element between the pixels, an internal compensation technology or an external compensation technology may be applied to the organic light emitting display device. In the internal compensation technology, a threshold voltage of the driving element is sampled for each sub-pixel using an internal compensation circuit implemented in each pixel circuit, and a gate-source voltage Vgs of the driving element is compensated by the threshold voltage. The external compensation technology uses an external compensation circuit to sense a current or voltage of the driving element which changes according to the electrical characteristics of the driving elements in real time. Since the external compensation technology modulates pixel data (digital data) of an input image as much as the electrical characteristic variation (or change) of the driving element sensed for each pixel, the electrical characteristic variation (or change) of the driving element is compensated in each of the pixels in real time.

Figure 5:
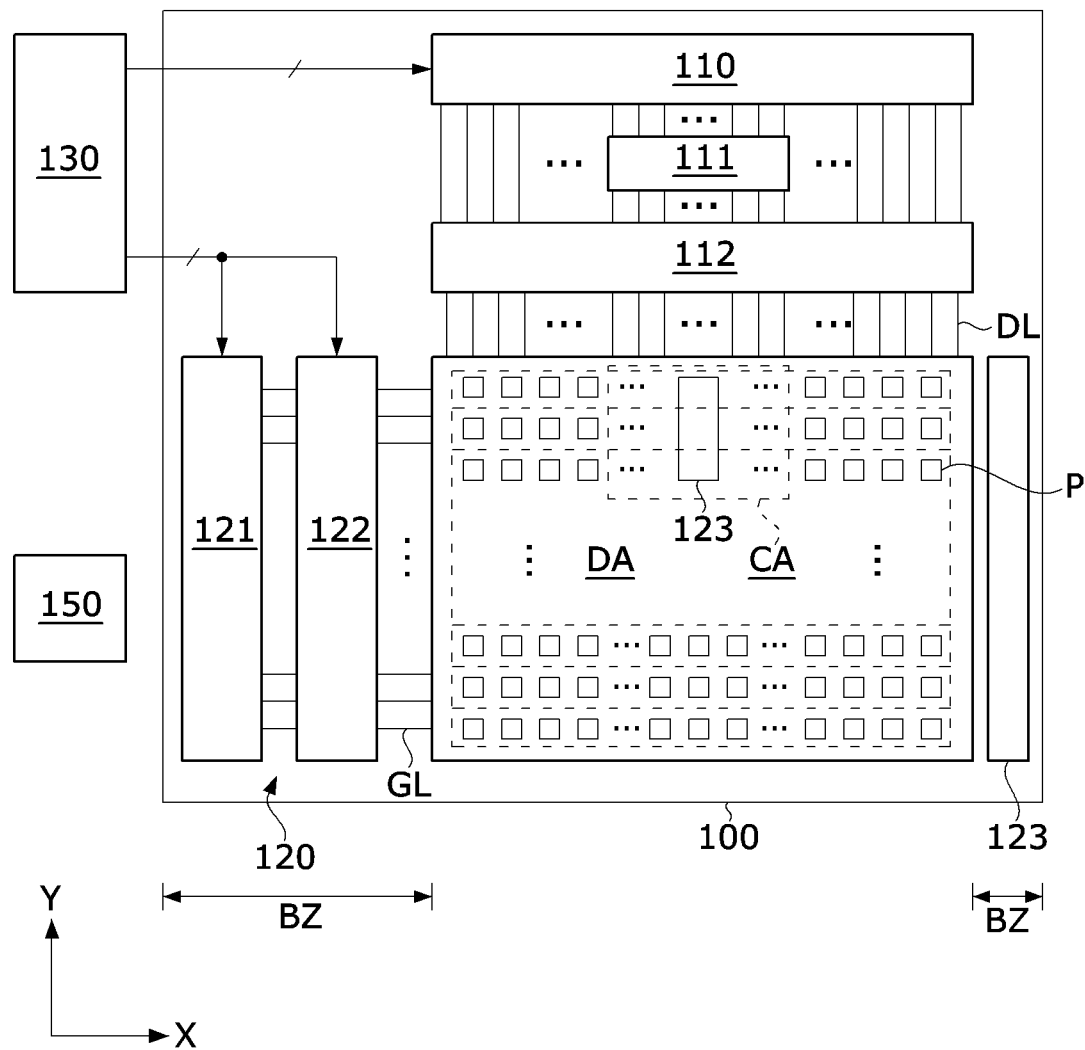
FIG. 5 is a block diagram illustrating a display device according to the embodiment of the present disclosure.

FIG. 5 is a block diagram illustrating the display device according to the embodiment of the present disclosure.

Referring to FIG. 5, the display device according to the embodiment of the present disclosure includes the display panel 100, display panel driving parts 110, 111, 120 for writing the pixel data of the input image to pixels P of the display panel 100, a timing controller 130 for controlling the display panel driving part, and a power supply 150 which generates power for driving the display panel 100.

The display panel 100 includes a pixel array which displays the input image on the screen. As described above, the pixel array may be divided into the first region DA and the second region CA having a lower resolution or PPI compared to the first region DA. Since the first region DA has a larger size compared to the second region CA by including the high-PPI pixels P, most image information is displayed in the first region DA. A sensor module overlapping the second region CA may be disposed under the display panel 100.

Touch sensors may be disposed on the screen of the display panel 100. The touch sensors may be disposed on the screen of the display panel in an on-cell type or an add-on type or implemented as in-cell type touch sensors which are embedded in the pixel array.

The display panel 100 may be implemented as a flexible display panel in which the pixels P are disposed on a flexible substrate such as a plastic substrate or a metal substrate. In a flexible display, the size and shape of the screen may be varied by a method of rolling, folding, or bending the flexible display panel. The flexible display may include a slidable display, a rollable display, a bendable display, a foldable display, and the like.

The display panel driving part may drive the pixels P by applying the internal compensation technology.

The display panel driving part reproduces the input image on the screen of the display panel 100 by writing the pixel data of the input image to the sub-pixels. The display panel driving part includes a first data driving part 110, a second data driving part 111, first gate driving parts 120, and a second gate driving part 123. The display panel driving part may further include a demultiplexer 112 disposed between the data driving parts 110 and 111 and data lines DL.

The display panel driving part may operate in a low speed driving mode under control of the timing controller 130. In the low speed driving mode, when the input image does not change for a predetermined (or selected) time by analyzing the input image, power consumption of the display device may be reduced. In the low speed driving mode, when a still image is input for a predetermined (or selected) time or more, as a refresh rate of the pixels P is lowered, power consumption may be reduced by controlling a data write period of the pixels P to be longer. The low speed driving mode is not limited to the case in which the still image is input. For example, when the display device operates in a standby mode or when a user command or the input image is not input to a display panel driving circuit for a predetermined (or selected) time or more, the display panel driving circuit may operate in the low speed driving mode.

The first data driving part 110 samples pixel data to be written to the pixels of the first region DA from the pixel data received from the timing controller 130. The first data driving part 110 converts the pixel data to be written to the pixels of the first region DA to a gamma compensation voltage to output a data voltage Vdata using a digital to analog converter (hereinafter referred to as "DAC"). The data voltage Vdata output from channels of the first data driving part 110 may be applied to the data lines DL connected to the pixels of the first region DA through the demultiplexer 112 or may be applied directly to the data lines DL.

The second data driving part 111 receives pixel data to be written to the pixels of the second region CA from the pixel data received from the timing controller 130 as a digital signal. The second data driving part 111 converts the pixel data to be written to the pixels of the second region CA to the gamma compensation voltage to output the data voltage Vdata using the DAC. The data voltage Vdata output from channels of the second data driving part 111 is applied to the data lines DL connected to the pixels of the second region CA through the demultiplexer 112 or may be applied directly to the data lines DL.

Each of the first and second data driving parts 110 and 111 may include a voltage divider circuit which outputs the gamma compensation voltage. The voltage divider circuit divides a gamma reference voltage from the power supply 150 to generate the gamma compensation voltage for each gray level, and provides the gamma compensation voltage to the DAC. The DAC converts the pixel data to the gamma compensation voltage and outputs the data voltage Vdata.

The demultiplexer 112 distributes the data voltage Vdata output through the channels of the data driving parts 110 and 111 by time-dividing the data voltage Vdata to the plurality of data lines DL. Due to the demultiplexer 112, the number of channels of the data driving part 110 may be reduced. The demultiplexer 112 may be omitted.

The first gate driving parts 120 may be implemented as a gate in panel (GIP) circuit formed directly on a bezel region BZ of the display panel 100 together with a thin film transistor (TFT) array of the pixel array. The gate driving parts 120 output a gate signal to the gate lines GL connected to the pixels of the first region DA under the control of the timing controller 130. The first gate driving parts 120 may sequentially supply the signals to the gate lines GL connected to the pixels of the first region DA by shifting the gate signal using a shift register. The voltage of the gate signal swings between a gate-off voltage VGH and a gate-on voltage VGL. The gate signal applied to the pixels of the first region DA may include a pulse of the scan signal (hereinafter referred to as "scan pulse"), a pulse of a light emission control signal (hereinafter referred to as "EM pulse"), and the like. The gate lines GL connected to the pixels of the first region DA may include scan lines to which the scan pulse is applied and EM lines to which the EM pulse is applied.

The first gate driving parts 120 may be disposed on each of left and right bezels BZ of the display panel 100 to supply the gate signal to the gate lines GL in a double feeding method. In the double feeding method, the gate driving parts 120 divided and disposed on both bezels of the display panel 100 are synchronized by the timing controller 130 so that the gate signals may be simultaneously applied at both ends of one gate line. In another embodiment, the first gate driving part 120 may be disposed on one of the left and right bezels of the display panel 100 to supply the gate signal to the gate lines GL in a single feeding method.

The first gate driving parts 120 may include a 1-1 gate driving part 121 and a 1-2 gate driving part 122. The 1-1 gate driving part 121 outputs the scan pulse, and shifts the scan pulse according to a shift clock to sequentially supply the scan pulse to the scan lines connected to the pixels of the first region DA. The 1-2 gate driving part 122 outputs the EM pulse, and shifts the EM pulse according to the shift clock to sequentially supply the EM pulse to the EM lines connected to the pixels of the first region DA.

The second gate driving part 123 outputs the gate signal to the gate lines GL connected to the pixels of the second region CA under the control of the timing controller 130. The second gate driving part 123 may sequentially supply the signals to the gate lines GL connected to the pixels of the second region CA by shifting the gate signal using a shift register. The voltage of the gate signal swings between a gate-off voltage VGH and a gate-on voltage VGL. The gate signal applied to the pixels of the second region CA may include a scan pulse. The gate lines GL connected to the pixels of the second region CA may include scan lines to which the scan pulse is applied.

The second gate driving part 123 may be implemented as a gate in array (GIA) circuit disposed on at least one of the left and right bezels BZ of the display panel 100 or disposed in the second region CA. Further, a part of the second gate driving part 123 may be disposed in the second region CA, and the remaining circuit configuration of the second gate driving part 123 may be disposed in the bezel region BZ of the display panel 100. The second gate driving part 123 outputs the scan pulse, shifts the scan pulse according to the shift clock, and sequentially supplies the scan pulse to the scan lines connected to the pixels of the second region CA.

The timing controller 130 receives the pixel data of the input image and a timing signal synchronized with the pixel data from a host system. The timing signal includes a vertical synchronization signal Vsync, a horizontal synchronization signal Hsync, a clock CLK, and a data enable signal DE. One period of the vertical synchronization signal Vsync is one frame period. One period of the horizontal synchronization signal Hsync and the data enable signal DE is one horizontal period 1H. The pulse of the data enable signal DE is synchronized with one line of data to be written to the pixels P of one pixel line. Since the frame period and the horizontal period may be known by counting the data enable signal DE, the vertical synchronization signal Vsync and the horizontal synchronization signal Hsync may be omitted.

The timing controller 130 may multiply an input frame frequency by i (i is a natural number) and control an operation timing of each of the display panel driving parts 110, 112, and 120 at a frame frequency of the input frame frequency×i Hz. The input frame frequency is 60 Hz in the National Television Standards Committee (NTSC) method and 50 Hz in the Phase-Alternating Line (PAL) method. The timing controller 130 may lower the frame frequency to a frequency between 1 Hz and 30 Hz in order to lower the refresh rate of the pixels P in the low speed driving mode.

The timing controller 130 transmits the pixel data of the input image to the first and second data driving parts 110 and 111 and controls the operation timing of the display panel driving part to synchronize the first and second data driving parts 110 and 111, the demultiplexer 112, and the first and second gate driving parts 120 and 123. The timing controller 130 generates a data timing control signal for controlling the operation timing of the data driving parts 110 and 111, a switch control signal for controlling the operation timing of the demultiplexer 112, and a gate timing control signal for controlling the operation timing of the gate driving parts 120 based on the timing signals Vsync, Hsync, and DE received from the host system.

The gate timing control signal may include a start pulse, a shift clock, a reset signal, an initialization signal, and the like. A voltage level of the gate timing control signal output from the timing controller 130 may be converted to a gate-off voltage VGH/VEH and a gate-on voltage VGL/VEL through a level shifter that is omitted in the drawing, and may be supplied to the gate driving part 120. The level shifter may convert a low level voltage of the gate timing control signal to the gate-on voltage VGL, and convert a high level voltage of the gate timing control signal to the gate-off voltage VGH.

The power supply 150 may include a charge pump, a regulator, a buck converter, a boost converter, a programmable gamma integrated circuit (P-GMA IC), and the like. The power supply 150 generates power for driving the display panel driving parts and the display panel 100 by adjusting a direct current (DC) input voltage from the host system. The power supply 150 may output DC voltages such as a gamma reference voltage, the gate-off voltage VGH/VEH, the gate-on voltage VGL/VEL, a pixel driving voltage ELVDD, a low-potential power supply voltage ELVSS, an initialization voltage Vini, a reference voltage Vref, and the like. The programmable gamma IC may change the gamma reference voltage according to a register setting value. The gamma reference voltage is supplied to the data driving part 110. The gate-off voltage VGH/VEH and the gate-on voltage VGL/VEL are supplied to the level shifter and the gate driving part 120. The pixel driving voltage ELVDD, the low-potential power supply voltage ELVSS, the initialization voltage Vini, and the reference voltage Vref are commonly supplied to pixel circuits through the power lines. The pixel driving voltage ELVDD is set to a voltage higher than the low-potential power supply voltage ELVSS, the initialization voltage Vini, and the reference voltage Vref.

The host system may be a main circuit board of a wearable device, a television (TV) system, a set-top box, a navigation system, a personal computer (PC), a vehicle system, a home theater system, or a mobile device.

Figure 6:
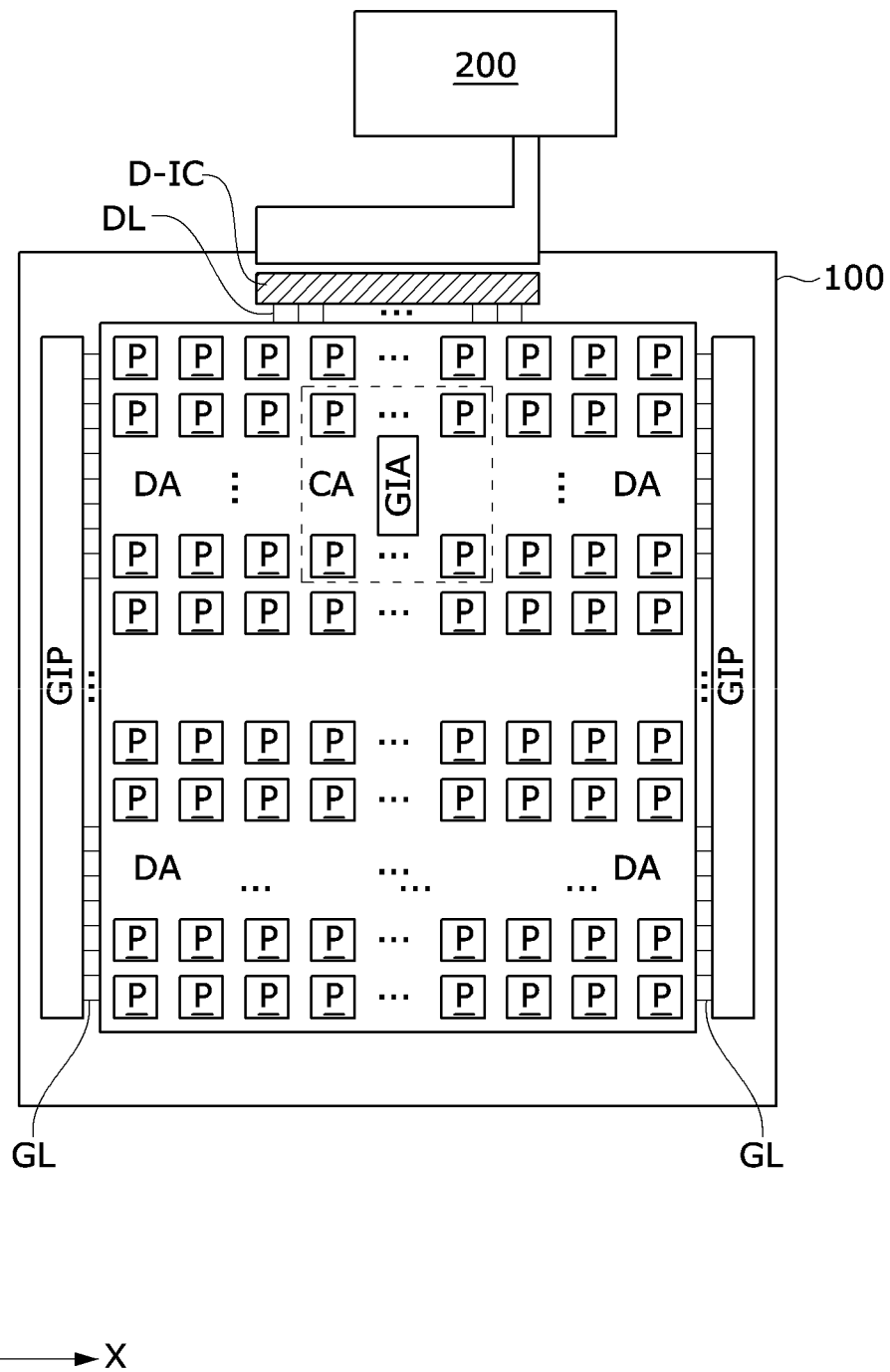
FIG. 6 is a view illustrating an example in which the display device according to the embodiment of the present disclosure is applied to a mobile device.

In the mobile device or the wearable device, the timing controller 130, the data driving part 110, and the power supply 150 may be integrated into one drive IC (D-IC) as shown in FIG. 6. In FIG. 6, reference numeral "200" refers to a host system.

Figure 7:
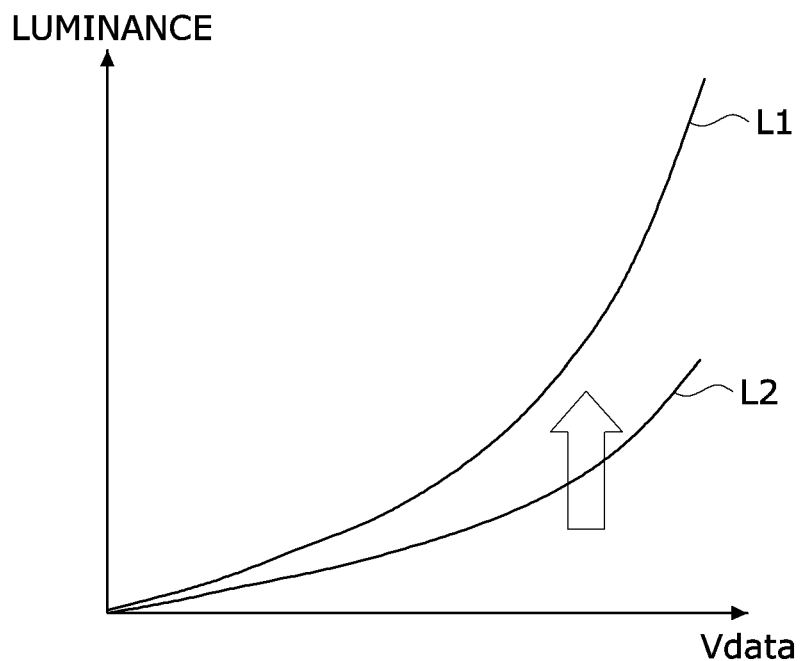
FIG. 7 is a view illustrating a luminance difference between the regions due to a pixels-per-inch (PPI) difference of the first and second regions of the screen.

The PPI of the second region CA is lower than that of the first region DA. Accordingly, when the data voltage Vdata applied to the pixels P of the second region CA is the same as the data voltage Vdata applied to the pixels P of the first region DA at the same gray level, as shown in FIG. 7, luminance L2 of the second region CA may be lower than luminance L1 of the first region DA.

Figure 8:
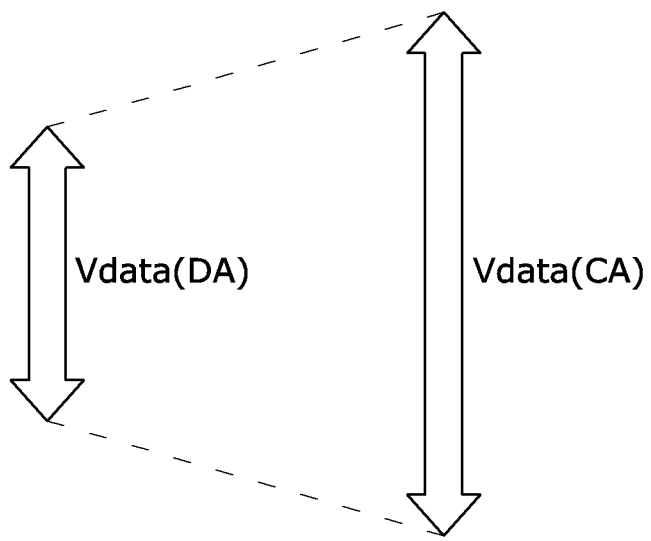
FIG. 8 is a view illustrating an example in which a voltage range of a data voltage applied to pixels of the second region is set to be larger than a voltage range of a data voltage applied to the first region.

In order to compensate for a luminance difference between the first and second regions DA and CA, a data voltage Vdata (CA) output from the second data driving part 111 may be set to a larger voltage range than a data voltage Vdata (DA) output from the first data driving part 110 as shown in FIG. 8. The data voltage Vdata is determined according to the gamma compensation voltage. Accordingly, in order to extend the voltage range of the data voltage Vdata (CA), the output voltage range of the programmable gamma IC may be expanded.

Figure 9:
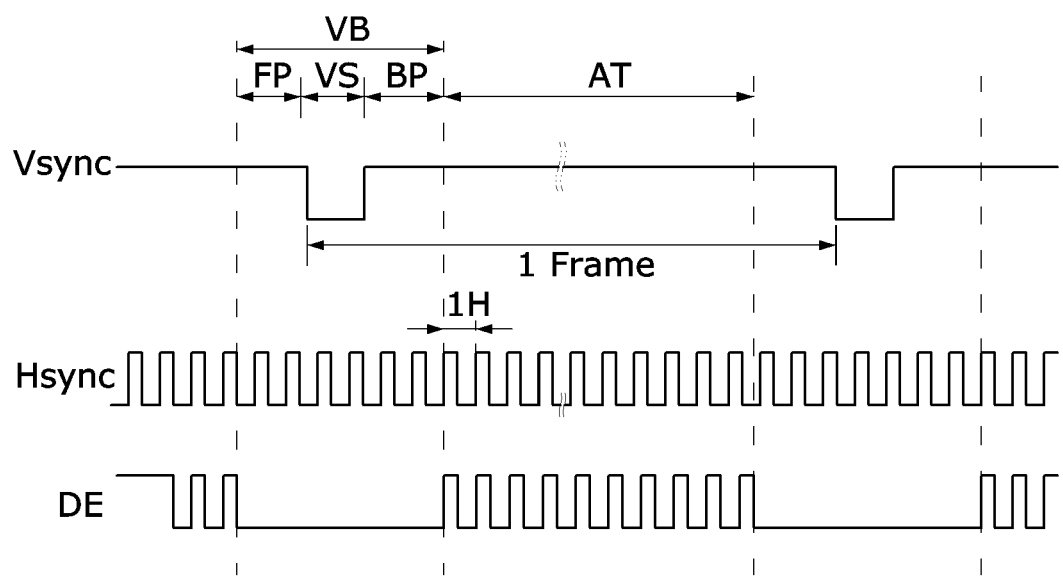
FIG. 9 is a view illustrating an active period and a vertical blank period of one frame period in detail.

FIG. 9 is a view illustrating an active period and a vertical blank period of one frame period in detail. In FIG. 9, the vertical synchronization signal Vsync, the horizontal synchronization signal Vsync, and the data enable signal DE are timing signals synchronized with the pixel data of the input image.

Referring to FIG. 9, one frame period is divided into an active period AT in which the pixel data of the input image is written to the pixels, and a vertical blank period VB without the pixel data.

The vertical blank period VB is a blank period in which the pixel data is not received by the timing controller 130 between the active period AT of an N−1th (N is a natural number) frame period and the active period AT of an Nth frame period. The vertical blank period VB includes a vertical sync time VS, a vertical front porch FP, and a vertical back porch BP.

The vertical synchronization signal Vsync defines one frame period. The horizontal synchronization signal Hsync defines one horizontal period 1H. The data enable signal DE defines an effective data section including the pixel data to be written to the pixels. A pulse of the data enable signal DE is synchronized with the pixel data to be written to the pixels of the display panel 100. One pulse period of the data enable signal DE is the one horizontal period 1H.

Since the sensor module which receives the external light is disposed in the second region CA, it is beneficial to reduce the size of the pixel circuit. When the internal compensation technique of sampling and compensating the threshold voltage of the driving element DT is applied to the pixel circuit, the number of transistors and gate signals for driving the pixel circuit may increase. When the number of transistors and gate signals for the pixel circuit disposed in the second region CA is reduced, the transmittance may be increased by enlarging the light transmitting parts AG in the second region CA. In contrast, there is no need to increase the transmittance of the first region DA. When the transistor and the gate signal for the pixel circuit of the second region CA are different from those of the first region DA, the data voltage and the gate signal applied to the second region CA may be different from those applied to the first region DA. In this case, as shown in FIG. 10, the data lines DL and the gate lines GL may be separated between the first region DA and the second region CA.

Figure 10:
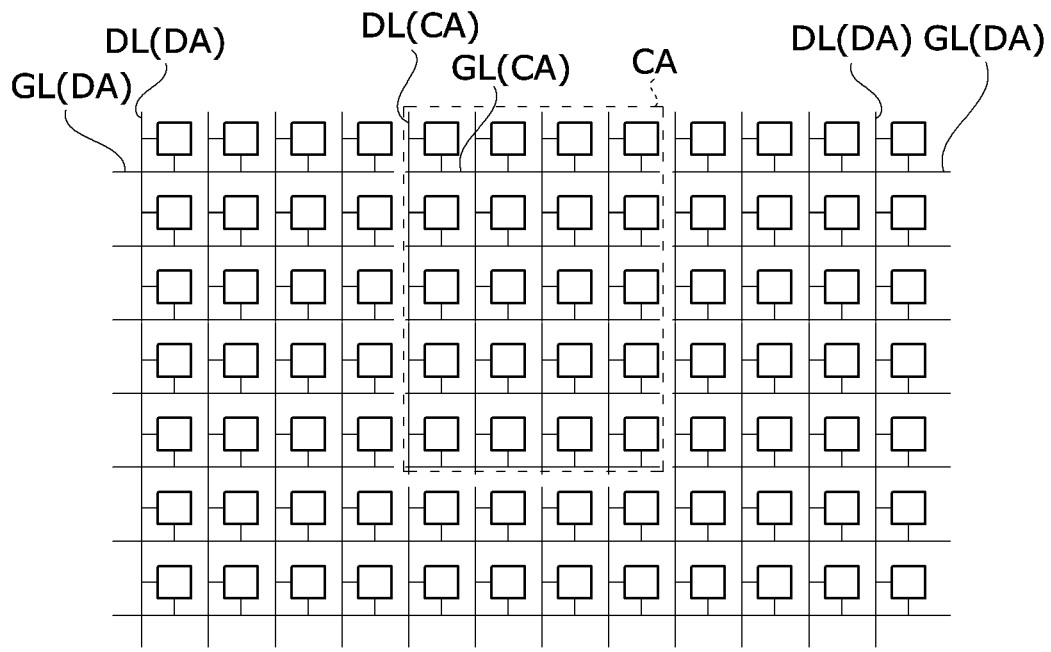
FIG. 10 is a view illustrating an example in which data lines and gate lines are separated between the first and second regions.

FIG. 10 is a view illustrating an example in which the data lines DL and the gate lines GL are separated between the first region DA and the second region CA.

Referring to FIG. 10, DL(DA) and GL(DA) refer to data lines and gate lines connected to the pixels of the first region DA, respectively. The gate lines connected to the pixels of the first region DA may include a scan line and an EM line.

DL(CA) and GL(CA) refer to data lines and gate lines connected to the pixels of the second region CA, respectively. The gate lines connected to the pixels of the second region CA may include a scan line without an EM line.

In the present disclosure, the number of transistors for the pixel circuit of the second region CA is reduced compared to the pixel circuit of the first region DA to increase the transmittance of the second region CA.

Figure 11:
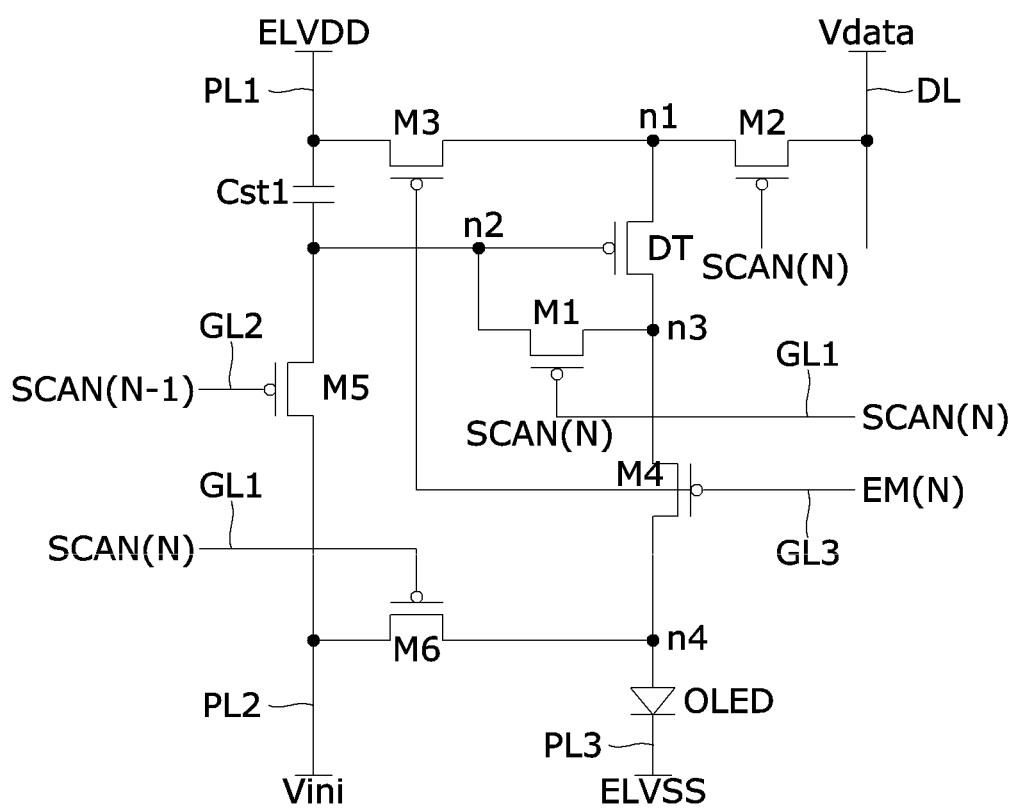
FIG. 11 is a circuit diagram illustrating an example of a pixel circuit applicable to the first region.
Figure 12:
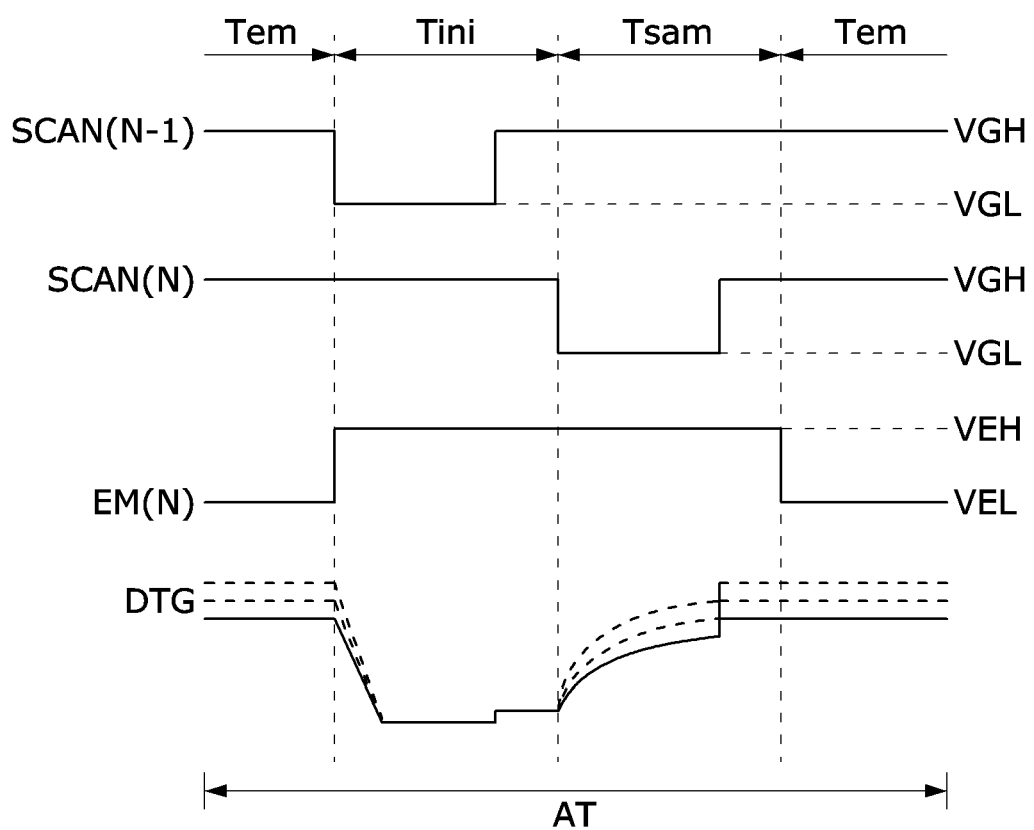
FIG. 12 is a waveform diagram illustrating a driving method of the pixel circuit shown in FIG. 11.

FIG. 11 is a circuit diagram illustrating an example of the pixel circuit applicable to the first region DA. FIG. 12 is a waveform diagram illustrating a driving method of the pixel circuit shown in FIG. 11. Hereinafter, the pixel circuit formed in each of the sub-pixels of the first region DA is referred to as a first pixel circuit.

Referring to FIGS. 11 and 12, the first pixel circuit includes a light emitting element OLED, a driving element DT which supplies a current to the light emitting element OLED, and a switch circuit which switches a voltage applied to the light emitting element OLED and the driving element DT.

The switch circuit is connected to power lines PL1, PL2 and PL3 to which a pixel driving voltage ELVDD, a low-potential power supply voltage ELVSS, and an initialization voltage Vini are applied, data lines DL, and gate lines GL1, GL2, and GL3, and switches the voltage applied to the light emitting element OLED and the driving element DT in response to scan pulses SCAN(N−1) and SCAN(N) and an EM pulse EM(N).

The switch circuit includes an internal compensation circuit which samples a threshold voltage Vth of the driving element DT using first to sixth switch elements M1 to M6 and applies a data voltage Vdata of the pixel data to the driving element DT. Each of the driving element DT and the switch elements M1 to M6 may be implemented with a p-channel TFT.

A driving period of the pixel circuit may be divided into an initialization period Tini, a sampling period Tsam, and a light emission period Tem as shown in FIG. 12. For each frame period, the initialization period Tini and the sampling period Tsam are defined in the scan pulse synchronized with the data voltage Vdata. Accordingly, after the pixel circuits are sequentially initialized by one pixel line according to the scan pulse sequentially applied to the scan lines in the first region DA every frame period during the active period AT, the threshold voltage Vth of the driving element DT is sampled.

The Nth scan pulse SCAN(N) is generated as the gate-on voltage VGL in the sampling period Tsam and is applied to an Nth scan line GL1. The Nth scan pulse SCAN(N) is synchronized with the data voltage Vdata applied to the pixels of an Nth pixel line. The N−1th scan pulse SCAN (N−1) is generated as the gate-on voltage VGL in the initialization period Tini prior to the sampling period and is applied to an N−1th scan line GL2. The N−1th scan pulse SCAN(N−1) is generated prior to the Nth scan pulse SCAN (N) and is synchronized with the data voltage Vdata applied to the pixels of the N−1th pixel line. The EM pulse EM(N) is generated as the gate-off voltage VGH in the initialization period Tin and the sampling period Tsam, and is applied to an EM line GL3. The EM pulse EM(N) may be simultaneously applied to the pixels of the N−1th and Nth pixel lines.

During the initialization period Tini, the N−1th scan pulse SCAN(N−1) of the gate-on voltage VGL is applied to the N−1th scan line GL2, and the EM pulse of the gate-off voltage VGH is applied to the EM line GL3. In this case, the Nth scan line GL1 is the gate-off voltage VGH. During the initialization period Tin, the fifth switch element M5 is turned on according to the gate-on voltage VGL of the N−1th scan pulse SCAN(N−1) to initialize the pixel circuit of the first region DA.

During the sampling period Tsam, the Nth scan pulse SCAN(N) of the gate-on voltage VGL is applied to the Nth scan line GL1. In this case, the N−1th scan line GL2 and the EM line GL3 are the gate-off voltage VGH. During the sampling period Tsam, since the first and second switch elements M1 and M2 are turned on according to the gate-on voltage VGL of the Nth scan pulse SCAN(N) and thus the driving element DT is turned on, the threshold voltage Vth of the driving element DT is sampled and the data voltage Vdata compensated by the threshold voltage Vth is stored in a capacitor Cst1. At the same time, the sixth switch element M6 is turned on during the sampling period Tsam to lower the voltage of a fourth node n4 to a reference voltage Vref, thereby restraining the light emission of the light emitting element OLED.

When the light emission period Tem starts, the EM line GL3 is reversed to the gate-on voltage VGL. During the light emission period Tem, the scan lines GL1 and GL2 maintain the gate-off voltage VGH. During the light emission period Tem, since the third and fourth switch elements M3 and M4 are turned on, the light emitting element OLED may emit light. During the light emission period Tem, in order to accurately express the luminance of low grayscale, a voltage level of the EM pulse EM(N) may be reversed at a predetermined (or selected) duty ratio between the gate-on voltage VEL and the gate-off voltage VEH. In this case, the third and fourth switch elements M3 and M4 may repeatedly turn on/off according to the duty ratio of the EM pulse EM(N) during the light emission period Tem.

An anode of the light emitting element OLED is connected to the fourth node n4 between the fourth and sixth switch elements M4 and M6. The fourth node n4 is connected to the anode of the light emitting element OLED, a second electrode of the fourth switch element M4, and a second electrode of the sixth switch element M6. A cathode of the light emitting element OLED is connected to the VSS line PL3 to which the low-potential power supply voltage ELVSS is applied. The light emitting element OLED emits light with a current Ids flowing according to a gate-source voltage Vgs of the driving element DT. A current path of the light emitting element OLED is switched by the third and fourth switch elements M3 and M4.

The capacitor Cst1 is connected between the VDD line PL1 and a second node n2.

After the sampling period is finished, the data voltage Vdata compensated by the sampled threshold voltage Vth of the driving element DT is charged in the capacitor Cst1.

Since the data voltage Vdata in each of the sub-pixels is compensated by the threshold voltage Vth of the driving element DT, the characteristic variation of the driving element DT is compensated for in the sub-pixels.

The first switch element M1 is turned on in response to the gate-on voltage VGL of the Nth scan pulse SCAN(N) to connect the second node n2 and a third node n3. The second node n2 is connected to a gate electrode of the driving element DT, a first electrode of the capacitor Cst1, and a first electrode of the first switch element M1. The third node n3 is connected to a second electrode of the driving element DT, a second electrode of the first switch element M1, and a first electrode of the fourth switch element M4. A gate electrode of the first switch element M1 is connected to the Nth scan line GL1 to receive the Nth scan pulse SCAN(N). The first electrode of the first switch element M1 is connected to the second node n2, and the second electrode of the first switch element M1 is connected to the third node n3.

Since the first switch element M1 is turned on during a very short one horizontal period 1H in which the Nth scan signal SCAN(N) is generated as the gate-on voltage VGL in one frame period, a leakage current may occur in an off state. In order to restrain the leakage current of the first switch element M1, the first switch element M1 may be implemented with a transistor having a dual gate structure in which two transistors are connected in series.

The second switch element M2 is turned on in response to the gate-on voltage VGL of the Nth scan pulse SCAN(N) to supply the data voltage Vdata to the first node n1. A gate electrode of the second switch element M2 is connected to the Nth scan line GL1 to receive the Nth scan pulse SCAN(N). A first electrode of the second switch element M2 is connected to the first node n1. The second electrode of the second switch element M2 is connected to the data lines DL of the first region DA to which the data voltage Vdata is applied. The first node n1 is connected to the first electrode of the second switch element M2, a second electrode of the third switch element M3, and a first electrode of the driving element DT The third switch element M3 is turned on in response to the gate-on voltage VEL of the EM pulse EM(N) to connect the VDD line PL1 to the first node n1. A gate electrode of the third switch element M3 is connected to the EM line GL3 to receive the EM pulse EM(N). A first electrode of the third switch element M3 is connected to the VDD line PL1. The second electrode of the third switch element M3 is connected to the first node n1.

The fourth switch element M4 is turned on in response to the gate-on voltage VEL of the EM pulse EM(N) to connect the third node n3 to the anode of the light emitting element OLED. A gate electrode of the fourth switch element M4 is connected to the EM line GL3 to receive the EM pulse EM(N). The first electrode of the fourth switch element M4 is connected to the third node n3, and the second electrode is connected to the fourth node n4.

The fifth switch element M5 is turned on in response to the gate-on voltage VGL of the N−1th scan pulse SCAN (N−1) to connect the second node n2 to the Vini line PL2. A gate electrode of the fifth switch element M5 is connected to the N−1th scan line GL2 to receive the N−1th scan pulse SCAN(N−1). A first electrode of the fifth switch element M5 is connected to the second node n2, and a second electrode is connected to the Vini line PL2. In order to restrain the leakage current of the fifth switch element M5, the fifth switch element M5 may be implemented with a transistor having a dual gate structure in which two transistors are connected in series.

The sixth switch element M6 is turned on in response to the gate-on voltage VGL of the Nth scan pulse SCAN(N) to connect the Vini line PL2 to the fourth node n4. A gate electrode of the sixth switch element M6 is connected to the Nth scan line GL1 to receive the Nth scan pulse SCAN(N). A first electrode of the sixth switch element M6 is connected to the Vini line PL2, and a second electrode is connected to the fourth node n4.

In another embodiment, the gate electrodes of the fifth and sixth switch elements M5 and M6 may be commonly connected to the N−1th scan line GL2 to which the N−1th scan pulse SCAN(N−1) is applied. In this case, the fifth and sixth switch elements M5 and M6 may be simultaneously turned on in response to the N−1th scan pulse SCAN(N−1).

The driving element DT drives the light emitting element OLED by controlling the current flowing through the light emitting element OLED according to the gate-source voltage Vgs. The driving element DT includes a gate connected to the second node n2, the first electrode connected to the first node n1, and the second electrode connected to the third node n3.

During the initialization period Tini, the N−1th scan pulse SCAN(N−1) is generated as the gate-on voltage VGL. The Nth scan pulse SCAN(N) and the EM pulse EM(N) maintain the gate-off voltage VGH during the initialization period Tini. Accordingly, since the fifth switch element M5 is turned on during the initialization period Tini, the second and fourth nodes n2 and n4 are initialized to the initialization voltage Vini. A hold period may be set between the initialization period Tini and the sampling period Tsam. In the hold period, the voltage of the scan lines GL1 and GL2 and the EM lines GL3 are the gate-off voltage VGH.

During the sampling period Tsam, the Nth scan pulse SCAN(N) is generated as the gate-on voltage VGL. The pulse of the Nth scan pulse SCAN(N) is synchronized with the data voltage Vdata of the Nth pixel line. The N−1th scan pulse SCAN(N−1) and the EM pulse EM(N) maintain the gate-off voltage VGH during the sampling period Tsam. Accordingly, the first and second switch elements M1 and M2 are turned on during the sampling period Tsam.

During the sampling period Tsam, a gate electrode voltage DTG of the driving element DT is increased by the current flowing through the first and second switch elements M1 and M2. When the driving element DT is turned off, the gate electrode voltage DTG of the driving element DT is Vdata−|Vth|, and a source electrode voltage of the driving element DT is ELVDD−|Vth|. Accordingly, when the sampled threshold voltage Vth of the driving element DT is stored in the capacitor Cst1, the gate-source voltage Vgs of the driving element DT is ELVDD−Vdata. Accordingly, a current Ioled flowing through the light emitting element OLED during the light emission period Tem is not affected by the threshold voltage Vth of the driving element DT.

When the EM pulse EM(N) is the gate-on voltage VGL during the light emission period Tem, since the current flows between the ELVDD and the light emitting element OLED, the light emitting element OLED may emit light. During the light emission period Tem, the N−1th and Nth scan pulses SCAN(N−1) and SCAN(N) maintain the gate-off voltage VGH. During the light emission period Tem, the third and fourth switch elements M3 and M4 are turned on according to the gate-on voltage VGL of the EM pulse EM(N). When the EM pulse EM(N) is the gate-on voltage VGL, since the third and fourth switch elements M3 and M4 are turned on, the current flows through the light emitting element OLED. In this case, the current Ioled flowing through the light emitting element OLED through the driving element DT is Ioled=K(ELVDD−Vdata)$^2$. K is a constant value determined by charge mobility, a parasitic capacitance, a channel ratio (W/L), and the like of the driving element DT.

In the first pixel circuit, the current Ioled flowing through the light emitting element OLED increases as the data voltage Vdata output from the first data driving part 110 is lower. Accordingly, the first data driving part 110 outputs the data voltage Vdata as a negative gamma compensation voltage that the voltage decreases as the gray level increases.

Figure 13:
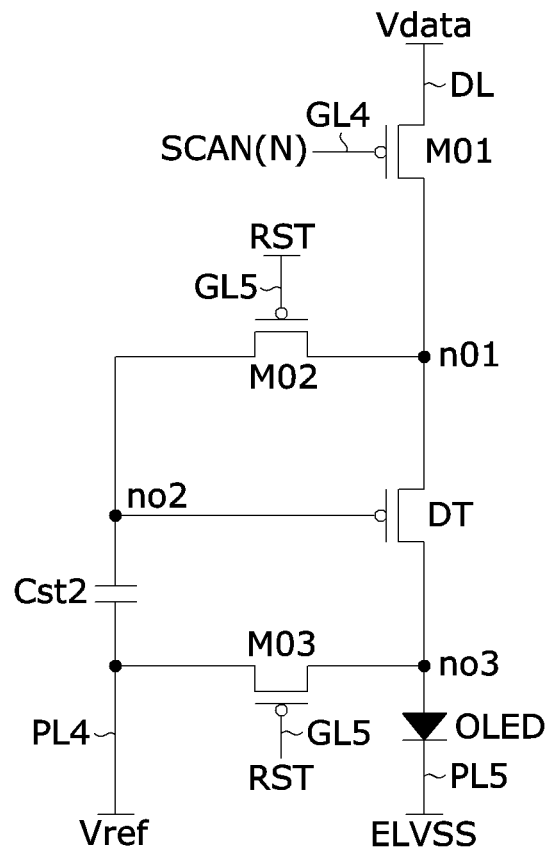
FIG. 13 is a circuit diagram illustrating an example of a pixel circuit applicable to the second region.
Figure 14:
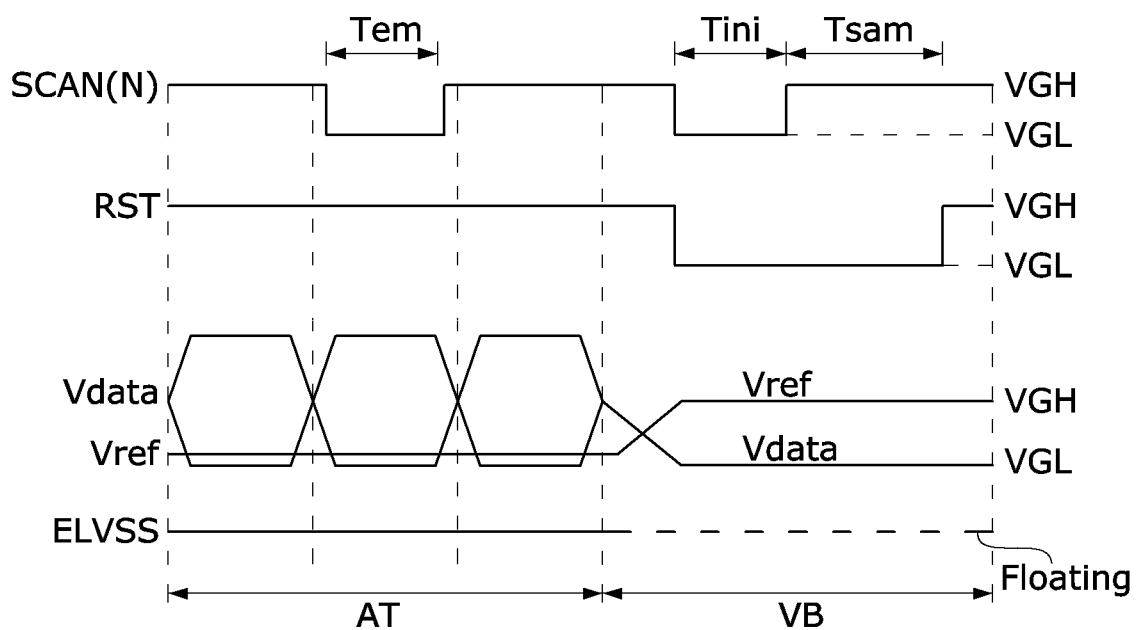
FIG. 14 is a waveform diagram illustrating a driving method of the pixel circuit shown in FIG. 13.
Figure 15:
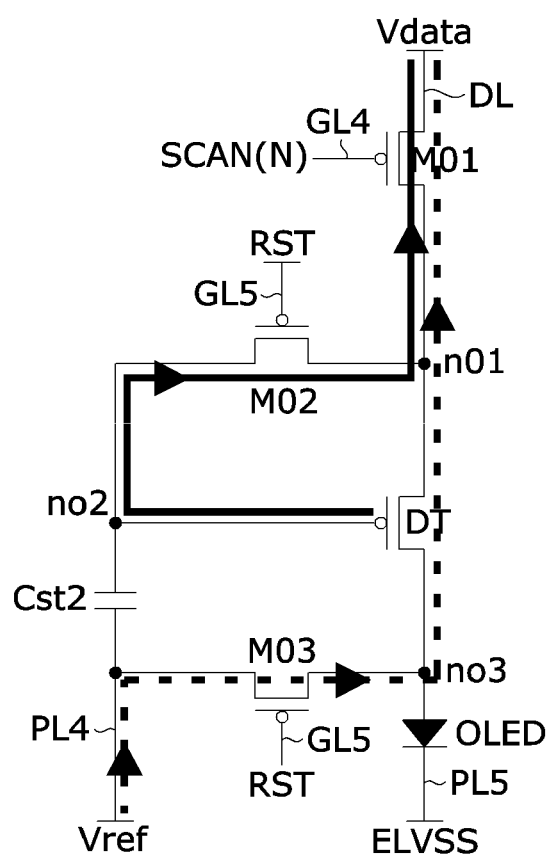
FIG. 15 is a view illustrating a current which flows through the pixel circuit during an initialization period in the pixel circuit shown in FIG. 13.
Figure 16:
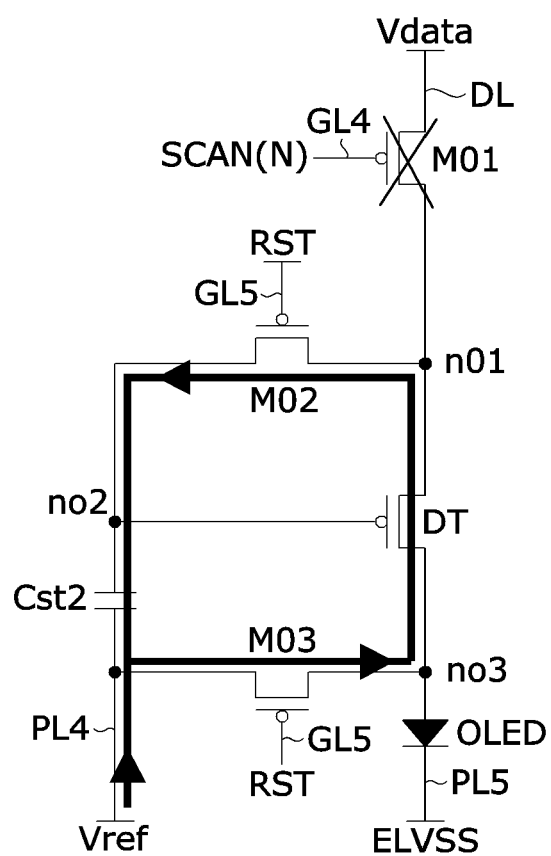
FIG. 16 is a view illustrating a current which flows through the pixel circuit during a sampling period in the pixel circuit shown in FIG. 13.
Figure 17:
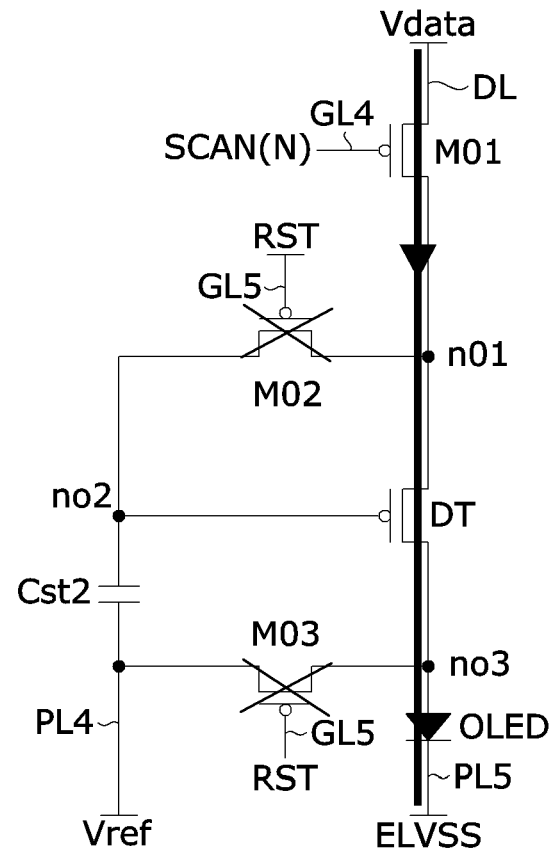
FIG. 17 is a view illustrating a current which flows through the pixel circuit during a light emission period in the pixel circuit shown in FIG. 13.

FIG. 13 is a circuit diagram illustrating an example of a pixel circuit applicable to the second region. FIG. 14 is a waveform diagram illustrating a driving method of the pixel circuit shown in FIG. 13. FIG. 15 is a view illustrating a current which flows through the pixel circuit during the initialization period in the pixel circuit shown in FIG. 13. FIG. 16 is a view illustrating a current which flows through the pixel circuit during the sampling period in the pixel circuit shown in FIG. 13. FIG. 17 is a view illustrating a current which flows through the pixel circuit during the light emission period in the pixel circuit shown in FIG. 13. Hereinafter, the pixel circuit formed in each of the sub-pixels of the second region CA is referred to as a second pixel circuit.

Referring to FIGS. 13 to 17, the second pixel circuit includes a light emitting element OLED, a driving element DT which supplies a current to the light emitting element OLED, and a switch circuit which switches a voltage applied to the light emitting element OLED and the driving element DT.

The switch circuit is connected to power lines PL4 and PL5 to which a pixel driving voltage ELVDD, a low-potential power supply voltage ELVSS, and an initialization voltage Vini are applied, data lines DL, and a scan line GL4, and switches the voltage applied to the light emitting element OLED and the driving element DT in response to a reset pulse RST and a scan pulse SCAN(N). The pixel driving voltage ELVDD and the EM pulse are not required in the second pixel circuit. A reference voltage Vref is set to a voltage higher than the low-potential power supply voltage ELVSS.

The switch circuit includes an internal compensation circuit which samples a threshold voltage Vth of the driving element DT using first to third switch elements M01, M02, and M03 after initializing the pixel circuits in all sub-pixels of the second region CA every frame period during the vertical blank period VB, and applies a data voltage Vdata of the pixel data to a gate electrode of the driving element DT during the active period AT. Each of the driving element DT and the switch elements M01, M02, and M03 may be implemented with a p-channel TFT.

A driving period of the pixel circuit may be divided into an initialization period Tini, a sampling period Tsam, and a light emission period Tem as shown in FIG. 14. For each frame period, the initialization period Tini and the sampling period Tsam are defined in the scan pulse synchronized with the data voltage Vdata. Accordingly, after the pixel circuits are sequentially initialized by one pixel line according to the scan pulse sequentially applied to the scan lines in the first region DA every frame period during the active period AT, the threshold voltage Vth of the driving element DT is sampled.

After a first scan pulse is applied to the scan line GL1 in the active period AT every frame period, a second scan pulse is applied in the vertical blank period VB. The first scan pulse SCAN(N) is generated as a gate-on voltage VGL in synchronization with the data voltage Vdata of the pixel data during the active period AT, and is applied to the scan line GL4. Subsequently, the second scan pulse SCAN(N) is generated as the gate-on voltage VGL in synchronization with the threshold voltage sampling data voltage Vdata in the initialization period Tini of the vertical blank period VB, and is applied to the scan line GL4. A reset pulse RTS is generated as the gate-on voltage VGL during the initialization period Tini and the sampling period Tsam of the vertical blank period VB, and is applied to a reset line GL5. The level shifter may receive a reset signal from the timing controller 130 to shift the voltage and apply the voltage to the reset line GL5.

The driving element DT drives the light emitting element OLED by controlling the current flowing through the light emitting element OLED according to a gate-source voltage Vgs. The driving element DT includes a gate electrode connected to a second node n02, a first electrode connected to a first node n01, and a second electrode connected to a third node n03. The first node n01 is connected to the first electrode of the driving element DT, a second electrode of the first switch element M01, and a second electrode of the second switch element M02. The second node n02 is connected to the gate electrode of the driving element DT, a first electrode of a capacitor Cst2, and a first electrode of the second switch element M02. A second electrode of the capacitor Cst2 is connected to an REF line PL4 to which the reference voltage Vref is applied. The third node n03 is connected to the second electrode of the driving element DT, an anode of the light emitting element OLED, and a second electrode of the third switch element M03.

The anode of the light emitting element OLED is connected to the third node n03. A cathode of the light emitting element OLED is connected to a VSS line PL5 to which a low-potential power supply voltage ELVSS is applied. The power supply 150 outputs the low-potential power supply voltage ELVSS to the VSS line PL5 during the active period AT, but does not output the low-potential power supply voltage ELVSS during the vertical blank period VB. Accordingly, the cathode of the light emitting element OLED is in a floating state in which no external voltage is applied during the vertical blank period VB.

The capacitor Cst2 is connected between the second node and the REF line PL4. The reference voltage Vref compensated by the threshold voltage Vth of the driving element DT is charged in the capacitor Cst2.

The first switch element M01 is turned on in response to the gate-on voltage VGL of the Nth scan pulse SCAN(N) during the active period AT to connect the data lines DL, to which the data voltage Vdata of the pixel data is applied, to the first node n01. The first switch element M01 includes a gate electrode connected to the scan line GL4, a first electrode connected to the data lines DL, and the second electrode connected to the first node n01.

The second switch element M02 is turned on in response to the gate-on voltage VGL of the reset pulse RST during the initialization period Tini and the sampling period Tsam of the vertical blank period VB to connect the first node n01 to the second node n02. The second switch element M02 includes a gate electrode connected to the reset line GL5 to which the reset pulse RST is applied, the first electrode connected to the second node n02, and the second electrode connected to the first node n01.

The third switch element M03 is turned on in response to the gate-on voltage VGL of the reset pulse RST during the initialization period Tini and the sampling period Tsam of the vertical blank period VB to connect the REF line PL4 to the third node n03. The third switch element M03 includes a gate electrode connected to the reset line GL5, a first electrode connected to the REF line PL4 to which the reference voltage Vref is applied, and the second electrode connected to the third node n03.

During the initialization period Tini of the vertical blank period VB, the pixel circuit is initialized in all sub-pixels of the second region CA. The sampling data voltage Vdata applied to the data lines DL of the second region CA during the initialization period Tini may be set to a data voltage lower than the reference voltage Vref. During the initialization period Tini, since the low-potential power supply voltage ELVSS is not output from the power supply 150, the cathode of the light emitting element OLED floats, and thus the light emitting element OLED does not emit light.

During the initialization period Tini, the first switch element M01 is turned on in response to the scan pulse SCAN(N) of the gate-on voltage VGL. The second and third switch elements M02 and M03 are turned on in response to the reset pulse RST of the gate-on voltage VGL. In this case, as shown in FIG. 15, since the first and second nodes n01 and n02 are discharged through the data lines DL of the second region CA, the gate voltage of the driving element DT is initialized to the sampling data voltage Vdata and the driving element DT is turned on. The third node n03 is initialized to the reference voltage Vref in the initialization period Tini.

During the sampling period Tsam of the vertical blank period VB, the threshold voltage Vth of the driving element DT is sampled in all sub-pixels of the second region CA and stored in the capacitor Cst2. The sampling data voltage Vdata is applied to the data lines DL of the second region CA during the sampling period Tsam. During the sampling period Tsam, since the low-potential power supply voltage ELVSS is not output from the power supply 150, the cathode of the light emitting element OLED maintains the floating state.

During the sampling period Tsam, since the voltage of the scan line GL4 is reversed to the gate-off voltage VGH, the first switch element M01 is turned off. Since the reset pulse RST is applied to the reset line GL5 during the sampling period Tsam, the second and third switch elements M02 and M03 remain on. In this case, as shown in FIG. 16, since the gate-source voltage Vgs of the driving element DT is turned on until reaching the threshold voltage Vth, the threshold voltage Vth of the driving element DT is sampled. In the sampling period Tsam, the capacitor Cst2 stores Vref+Vth.

During the light emission period Tem of the active period AT, the first switch element M01 is turned on in response to the scan pulse SCAN(N) of the gate-on voltage VGL as shown in FIG. 17. Since the voltage of the reset line GL5 is the gate-off voltage VGH during the active period AT, the second and third switch elements M02 and M03 remain off. In this case, a current Ioled flowing through the light emitting element OLED through the driving element DT is $Ioled=K(Vdata-Vref)^2$.

In the second pixel circuit, as the data voltage Vdata output from the second data driving part 111 increases, the current Ioled flowing through the light emitting element OLED increases. Accordingly, the first data driving part 110 outputs the data voltage Vdata as a positive gamma compensation voltage that the voltage increases as the gray level increases. Accordingly, since gamma characteristics of the data voltage Vdata output from the second data driving part 111 and the data voltage Vdata output from the first data driving part 110 are different, the data driving parts 110 and 110 are separated for each region.

Some power lines may be shared between the first pixel circuit and the second pixel circuit. For example, the pixel driving voltage ELVDD applied to the first pixel circuit and the reference voltage Vref applied to the second pixel circuit may be set to the same voltage. Accordingly, since the VDD line PL1 connected to the first pixel circuit and the REF line PL4 connected to the second pixel circuit are connected to each other, the first pixel circuit and the second pixel circuit may share the power lines.

Due to the low PPI of the second region CA, the luminance difference between the first region DA and the second region CA should be compensated for. In order to compensate for this luminance difference, a channel ratio (W/L) of the driving element DT disposed in the second region CA may become larger than that of the driving element DT disposed in the first region DA to increase a current for driving the light emitting element OLED.

Figure 18:
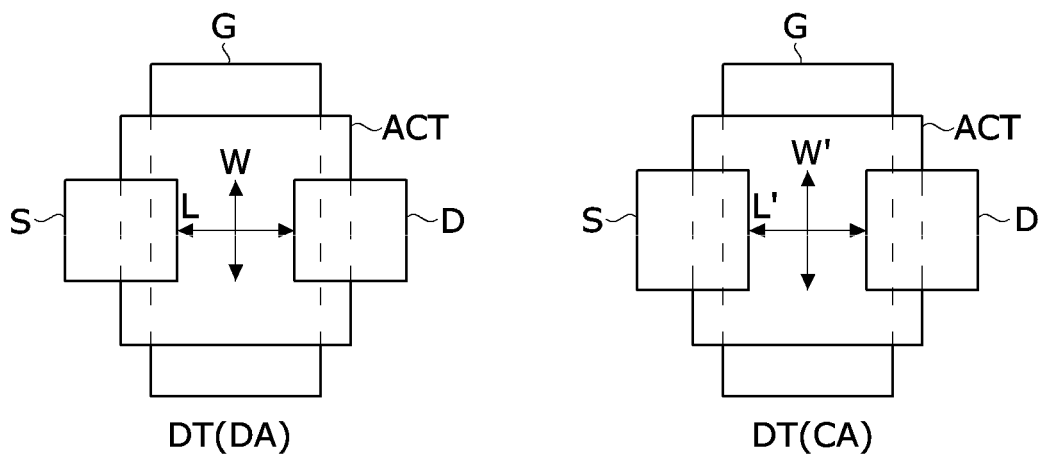
FIG. 18 is a plan view schematically illustrating a channel of a driving element in the first region and the second region.

In an example in FIG. 18, DT(DA) is a driving element DT disposed in the first region DA. DT(CA) is a driving element DT disposed in the second region CA.

Referring to FIG. 18, the driving element DT of the first region DA includes a gate electrode G, an active pattern ACT formed of a semiconductor, a first electrode S, and a second electrode D. Similarly, the driving element DT of the second region CA includes a gate electrode G, an active pattern ACT formed of a semiconductor, a first electrode S, and a second electrode D. When the driving element DT is turned on, a current flows through a channel between the first electrode S and the second electrode D on the active pattern ACT.

In order to increase the luminance of the second region CA to the same level as the first region DA, a channel ratio (W'/L') may be set larger by increasing a channel width W' of the driving element DT disposed in the second region CA or reducing a channel length L'.

Figure 19:
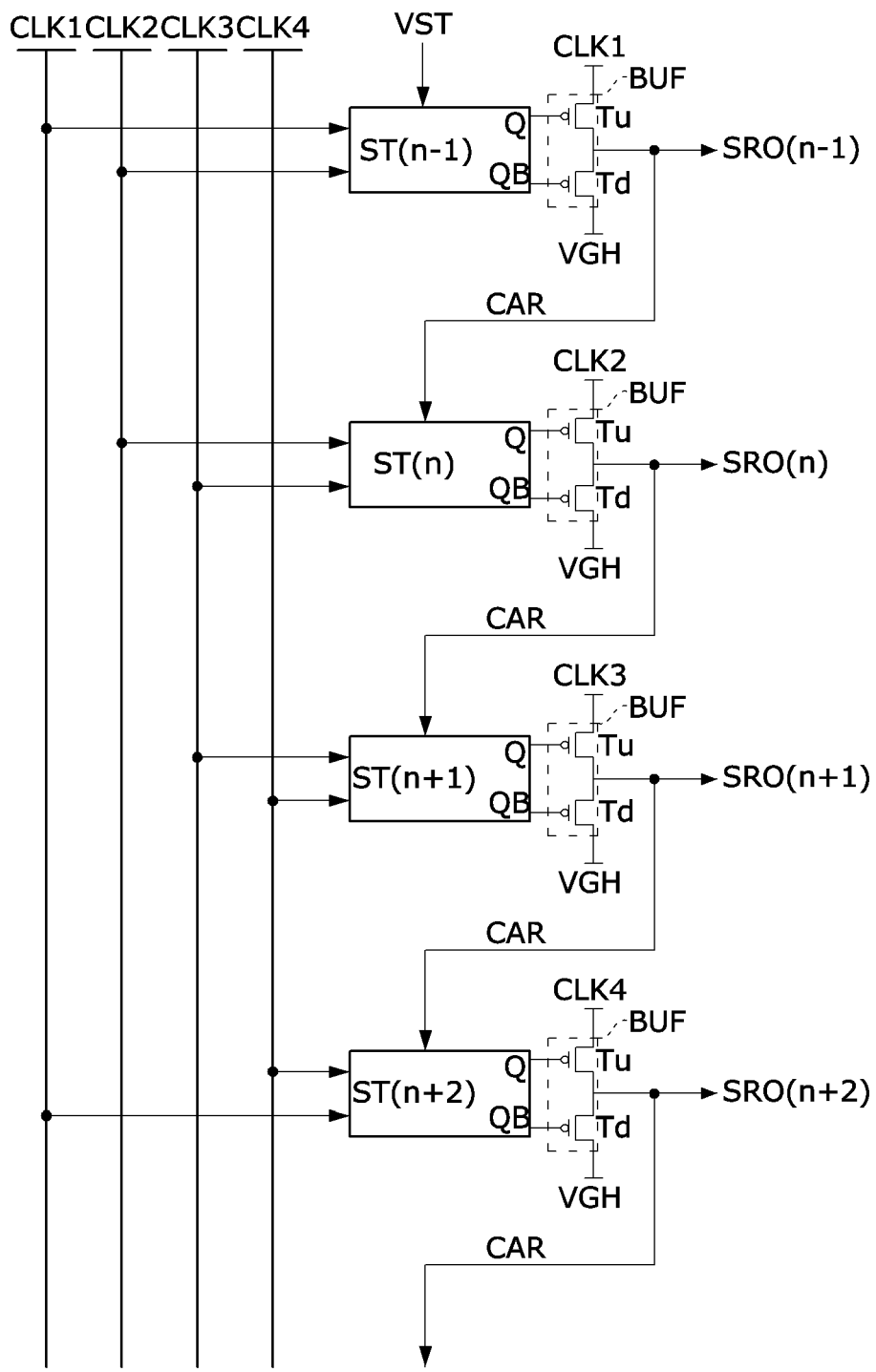
FIG. 19 is a block diagram schematically illustrating a shift register of a gate driving part.
Figure 20:
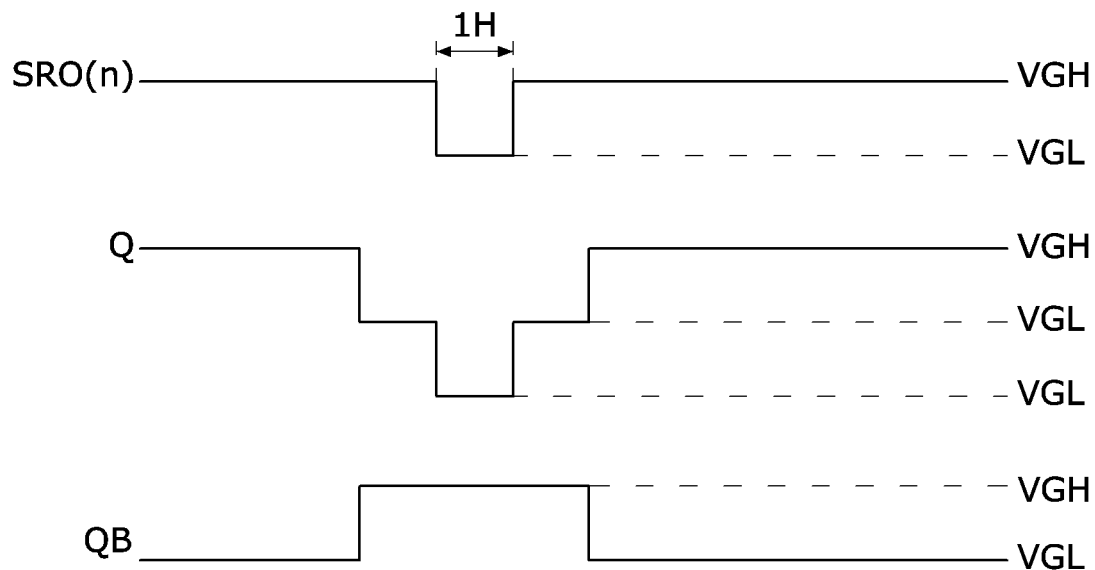
FIG. 20 is a waveform diagram illustrating control node voltages and an output signal of an nth signal transmitting part shown in FIG. 19.

FIG. 19 is a block diagram schematically illustrating shift registers of the gate driving parts 121 and 123 which output the scan pulse. FIG. 20 is a waveform diagram illustrating control node voltages and an output signal of an nth signal transmitting part shown in FIG. 19.

Referring to FIGS. 19 and 20, the shift register includes signal transmitting parts ST(i−1) to ST(i+2) which are subordinately connected. Each of the signal transmitting parts ST(i−1) to ST(i+2) includes a VST node to which a start pulse VST is input, a CLK node to which shift clocks CLK1 to CLK4 are input, and an output node from which scan pulses SRO(n−1) to SRO(n+2) are output. The start pulse VST is generally input to a first signal transmitting part of the shift register. The shift clocks CLK1 to CLK4 may be four phase clocks, but are not limited thereto.

In the example of FIG. 19, an N−1th signal transmitting part ST(n−1) may be the first signal transmitting part. Signal transmitting parts ST(n) to ST(n+2) subordinately connected to the N−1th signal transmitting part ST(n−1) receive a carry signal CAR from the previous signal transmitting part. The carry signal CAR may be the scan pulses SRO(n−1) to SRO(n+2) output from the previous signal transmitting part. Each of the signal transmitting parts may output the carry signal CAR through a carry signal output node. The carry signal is output simultaneously with the scan pulses SRO(n−1) to SRO(n+2) output from the previous signal transmitting part.

Each of the signal transmitting parts ST(i−1) to ST(i+2) includes a first control node Q, a second control node QB, and a buffer BUF. The buffer BUF outputs a gate signal through a pull-up transistor Tu and a pull-down transistor Td to a gate line through the output node.

The pull-up transistor Tu is turned on to charge the voltage of the output node to the gate-on voltage VGL when a voltage of the first control node Q is charged and the shift clocks CLK1 to CLK4 are input. In this case, the scan pulses SRO(n−1) to SRO(n+2) and the carry signal CAR rise to the gate-on voltage VGL. The voltage of the first control node Q is bootstrapped when the voltage of the shift clocks CLK1 to 4 changes to the gate-on voltage VGL, and thus increases to a gate-on voltage of approximately 2VGL. The pull-up transistor Tu is turned on when the voltage of the first control node Q is approximately higher than a threshold voltage thereof.

A voltage of the second control node QB is set to the gate-off voltage VGH when the first control node Q is charged to a voltage higher than or equal to the gate-on voltage VGL. The pull-down transistor Td is turned on when the voltage of the second control node QB is charged to the gate-on voltage VGL to supply the gate-off voltage VGH to the output node. In this case, the scan pulses SRO(n−1) to SRO(n+2) and the carry signal CAR fall to the gate-off voltage VGH.

Figure 21:
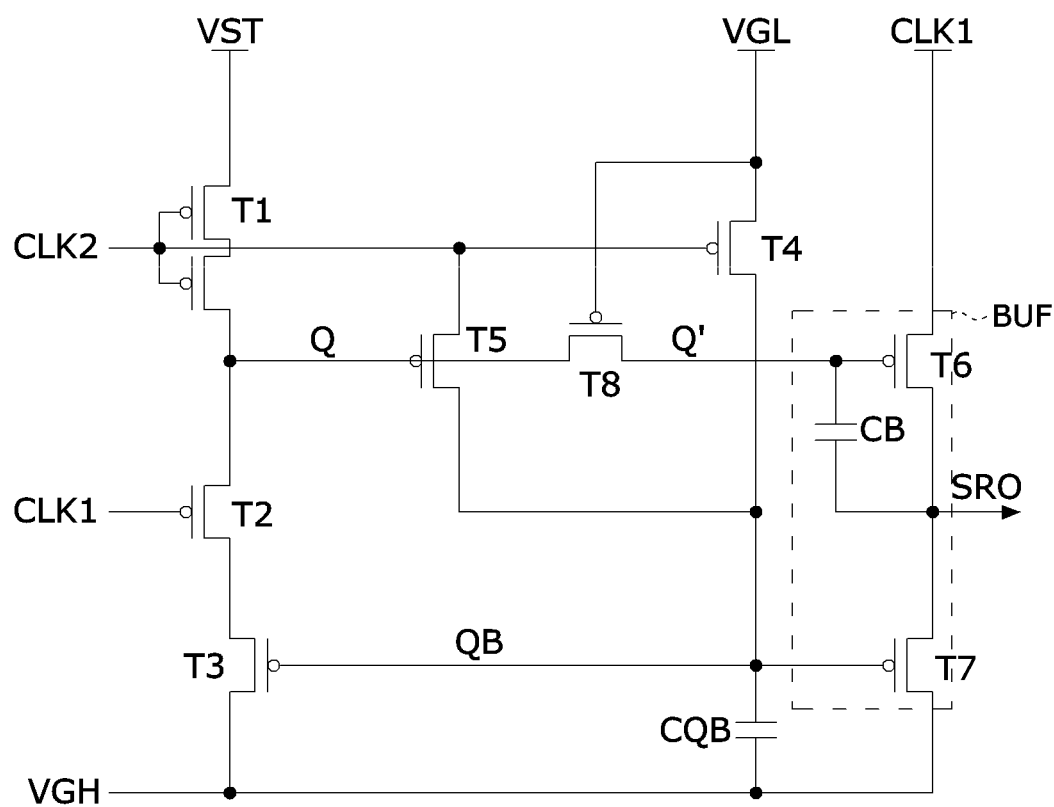
FIG. 21 is a circuit diagram illustrating an example of a signal transmitting part shown in FIG. 18.

FIG. 21 is a circuit diagram illustrating an example of the signal transmitting part shown in FIG. 18.

Referring to FIG. 21, each of the signal transmitting parts of the shift register includes a plurality of transistors T1 to T8.

A first transistor T1 is turned on in response to a gate-on voltage VGL of a second shift clock CLK2 to charge a 1-1 control node Q to a gate-on voltage VGL of a start pulse VST or a carry signal CAR. The first transistor T1 includes a gate connected to a second CLK node to which the second shift clock CLK2 is input, a first electrode connected to the VST node, and a second electrode connected to the 1-1 control node Q. The first transistor T1 may be implemented with a transistor having a dual gate structure in which two transistors are connected in series.

A second transistor T2 is turned on in response to a gate-on voltage VGL of a first shift clock CLK1 to connect the 1-1 control node Q to a first electrode of a third transistor T3. The second transistor T2 includes a gate connected to a first CLK node to which the first shift clock CLK1 is input, a first electrode connected to the 1-1 control node Q, and a second electrode connected to the first electrode of the third transistor T3.

The third transistor T3 is turned on in response to a gate-on voltage VGL of a second control node QB. When the second and third transistors T2 and T3 are turned on, the 1-1 control node Q is connected to a VGH node, and a voltage of the 1-1 control node Q is set to a gate-off voltage VGH. The third transistor T3 includes a gate connected to the second control node QB, the first electrode connected to the second electrode of the second transistor T2, and a second electrode connected to the VGH node.

Fourth and fifth transistors T4 and T5 charge the second control node QB to the gate-off voltage VGH when the 1-1 control node Q is the gate-on voltage VGL, and operate as an inverter which discharges the second control node QB to the gate-on voltage VGL when the 1-1 control node Q is the gate-off voltage VGH.

The fourth transistor T4 is turned on in response to the gate-on voltage VGL of the second shift clock CLK2 to connect the second control node QB to a VGL node and apply the gate-on voltage VGL to the second control node QB. The fourth transistor T4 includes a gate connected to the second CLK node, a first electrode connected to the VGL node, and a second electrode connected to the second control node QB.

The fifth transistor T5 is turned on in response to the gate-on voltage VGL of the 1-1 control node Q to connect the second control node QB to the second CLK node and apply the gate-off voltage VGH to the second control node QB. The fifth transistor T5 includes a gate connected to the 1-1 control node Q, a first electrode connected to the second CLK node, and a second electrode connected to the second control node QB.

A buffer BUF of the signal transmitting part includes sixth and seventh transistors T6 and T7. The sixth transistor T6 is a pull-up transistor that is turned on when a voltage of a 1-2 control node Q' rises to a voltage higher than VGL, for example, 2VGL. The sixth transistor T6 includes a gate connected to the 1-2 control node Q', a first electrode connected to the first CLK node to which the first shift clock CLK1 is applied, and a second electrode connected to an output node. The seventh transistor T7 is a pull-down transistor that is turned on when the second control node Q is at the gate-on voltage VGL to connect the output node to the VGH node. The seventh transistor T7 includes a gate connected to the second control node QB, a first electrode connected to the output node, and a second electrode connected to the VGH node. A capacitor CB is connected between the 1-2 control node Q' and the output node. A capacitor CQB is connected between the second control node QB and the VGH node.

An eighth transistor T8 is turned on in response to the gate-on voltage VGL to connect the 1-1 control node Q to the 1-2 control node Q'. The eighth transistor T8 includes a gate connected to the VGL node, a first electrode connected to the 1-1 control node Q, and a second electrode connected to the 1-2 control node Q'.

Figure 22:
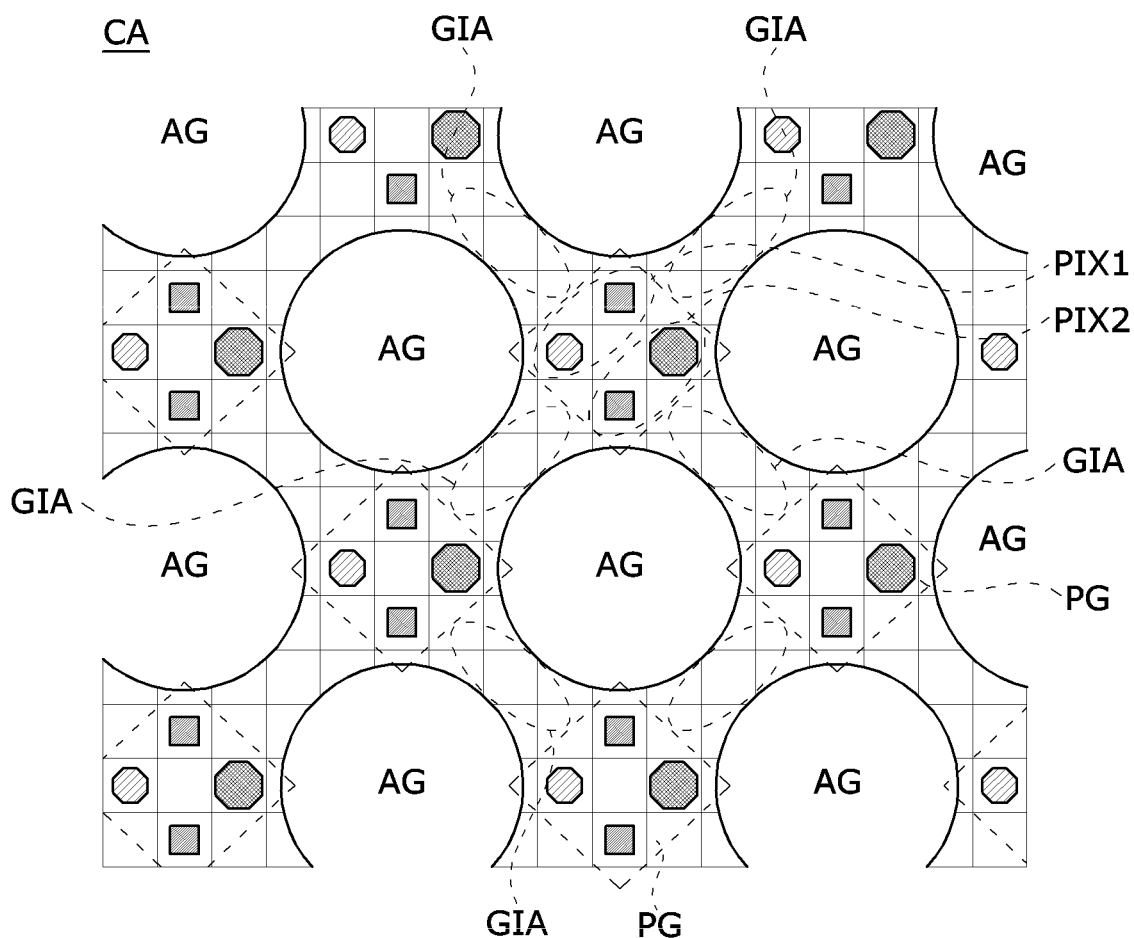
FIG. 22 is a view illustrating GIA regions in the second region.

The second region CA further includes a GIA region disposed between the light transmitting parts AG and the pixel groups PG, as shown in FIG. 22. In the GIA region, data lines DL, gate lines GL4 and GL5, power lines PL4 and PL5 which are connected to pixel circuits, and lines to which gate timing control signals VST and CLK1 to CLK4 are applied are arranged, and at least some of the circuit elements constituting the second gate driving part may be disposed. For example, among the transistors constituting the signal transmitting part, the first to seventh transistors may be disposed to be dispersed in two or more GIA regions. Further, among the transistors constituting the signal transmitting part, the transistors T6 and T7 constituting the buffer BUF may be disposed in the GIA region of the second region CA, and other transistors may be disposed in the bezel region BZ of the display panel 100.

The lines are disposed in the GIA regions of the second region CA and thus the GIA regions do not significantly affect the transmittance. When the transistors constituting the signal transmitting part shown in FIG. 21 are disposed to be dispersed in the GIA regions, the transmittance of the second region CA may be increased. On the other hand, when the second gate driving part is disposed at the boundary between the first and second regions, the boundary may be visible between the regions DA and CA, but when the signal transmitting parts of the second gate driving part are disposed to be dispersed in the GIA region of the second region, a problem in which boundaries between the regions are visible may be prevented.

Figure 23:
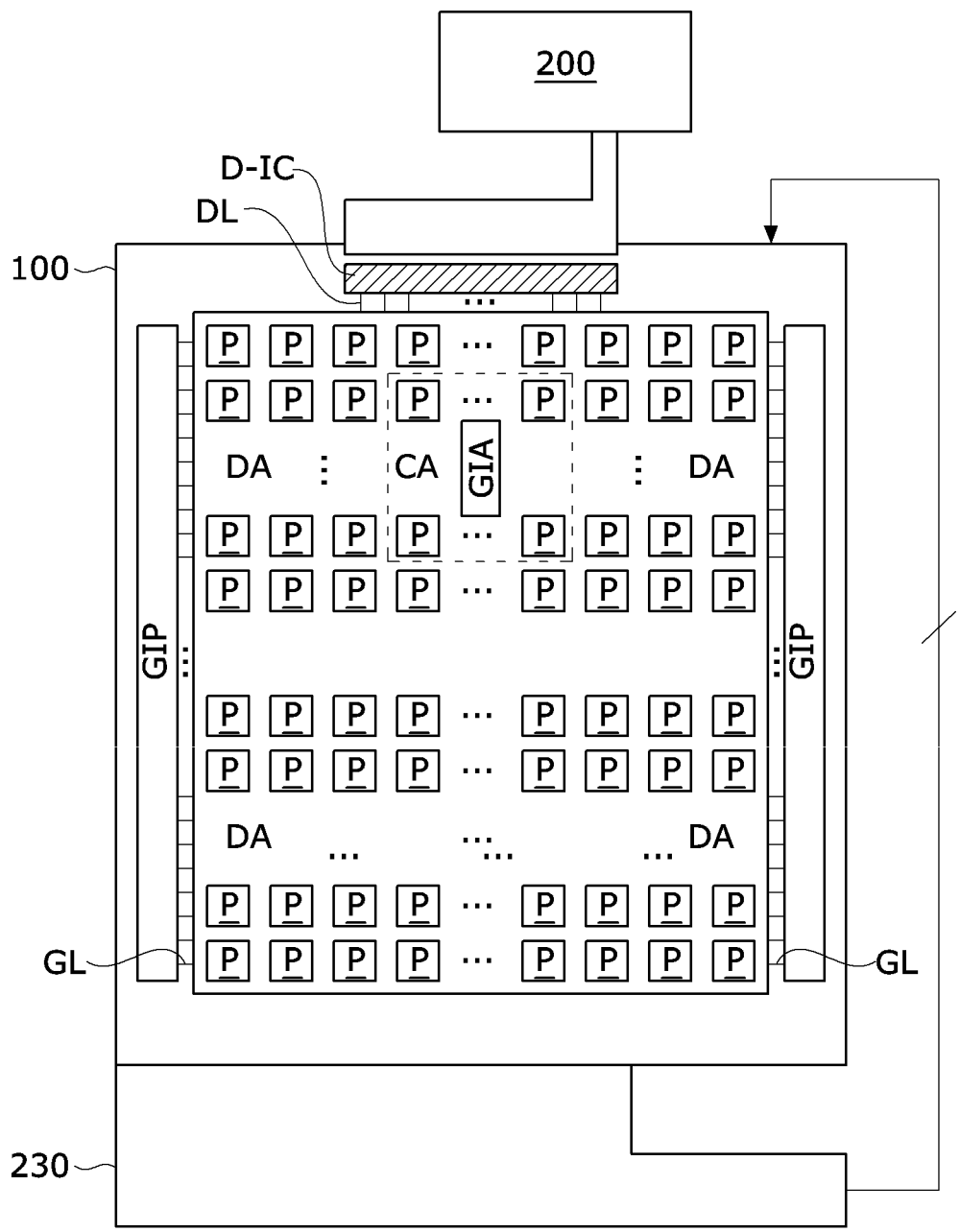
FIG. 23 is a view illustrating an example in which signals for driving the pixels of the second region are applied through a flexible circuit board connected to the display panel.

The second region CA may be disposed on an upper end of the display panel. As described above, the signal lines DL and GL are separated between the first and second regions DA and CA. As shown in FIG. 23, it is possible to apply necessary signals and power to the second region CA through a flexible circuit board 230 connected to a lower end of the display panel 100, for example, a flexible printed circuit (FPC). As described above, when the signal transmitting parts of the second gate driving part 213 are disposed in the second region CA, the size of the flexible circuit board 230 may be reduced or the flexible circuit board 230 may be removed.

In the present disclosure, since a sensor is disposed on a screen of the display panel on which an image is displayed, a screen of a full-screen display can be implemented.

In the present disclosure, since the number of transistors for a pixel circuit disposed in a second region in which pixels are disposed at a low pixel density (pixels per inch: PPI) is designed to be lower than the number of transistors for a pixel circuit in a first region in which the pixels are disposed at a high PPI, transmittance of the second region can be improved.

In the present disclosure, luminance between the first region and the second region can be uniformly realized by increasing a voltage range of a data voltage applied to the second region or increasing a channel ratio of driving elements disposed in the pixels of the second region.

In the present disclosure, since at least some of circuit elements constituting a gate driving part which drives gate lines of the second region are disposed to be dispersed in the second region, a bezel region of the display panel can be reduced without lowering the transmittance of the second region and a boundary between the regions can be invisible.

Effects of the present disclosure are not limited to the above-described effects, and other effects which are not mentioned can be apparently understood by those skilled in the art from a disclosure of claims.

The objects to be achieved by the present disclosure, the means for achieving the objects, and effects of the present disclosure described above do not specify essential features of the claims, and thus, the scope of the claims is not limited to the disclosure of the present disclosure.

Although the embodiments of the present disclosure have been described in more detail with reference to the accompanying drawings, the present disclosure is not limited thereto and may be embodied in many different forms without departing from the technical concept of the present disclosure. Therefore, the embodiments disclosed in the present disclosure are provided for illustrative purposes only and are not intended to limit the technical concept of the present disclosure. The scope of the technical concept of the present disclosure is not limited thereto. Therefore, it should be understood that the above-described embodiments are illustrative in all aspects and do not limit the present disclosure. The protective scope of the present disclosure should be construed based on the following claims, and all the technical concepts in the equivalent scope thereof should be construed as falling within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display panel comprising:
   a first region where pixels are disposed; and
   a second region where pixels having a lower pixel density compared to the first region are disposed, wherein a pixel density is pixels per inch PPI,
   wherein each of the pixels of the first region includes a first pixel circuit,
   each of the pixels of the second region includes a second pixel circuit, and
   the second pixel circuit includes fewer transistors compared to the first pixel circuit
   the first region includes data lines configured to supply a data voltage to the first pixel circuit, and gate lines configured to supply a gate signal to the first pixel circuit;
   the second region includes data lines configured to supply a data voltage to the second pixel circuit, and gate lines configured to supply a gate signal to the second pixel circuit;
   the data lines of the second region are separated from the data lines of the first region; and
   the gate lines of the second region are separated from the gate lines of the first region.

2. The display panel of claim 1, wherein:
   the first region further includes a VDD line to which a pixel driving voltage is applied, a Vini line to which an initialization voltage lower than the pixel driving voltage is applied, and a VSS line to which a low-potential power supply voltage lower than the pixel driving voltage is applied; and
   the gate lines of the first region include a scan line to which a scan pulse is applied, and an EM line to which an EM pulse is applied, wherein the EM pulse is a pulse of a light emission control signal.

3. The display panel of claim 2, wherein the first pixel circuit includes:
   a driving element including a first electrode coupled to a first node, a gate electrode coupled to a second node, and a second electrode coupled to a third node;
   a first switch element including a gate electrode coupled to an Nth scan line to which an Nth scan pulse is applied, and a first electrode coupled to the second node, and a second electrode coupled to the third node, N is a natural number;
   a second switch element including a gate electrode coupled to the Nth scan line, a first electrode coupled to the first node, and a second electrode coupled to the data line of the first region;
   a third switch element including a gate electrode coupled to the EM line, a first electrode coupled to the VDD line, and a second electrode coupled to the first node;
   a fourth switch element including a gate electrode coupled to the EM line, a first electrode coupled to the third node, and a second electrode coupled to a fourth node;
   a fifth switch element including a gate electrode coupled to an N−1th scan line to which an N−1th scan pulse is applied, a first electrode coupled to the second node, and a second electrode coupled to the Vini line;
   a sixth switch element including a gate electrode coupled to the Nth scan line or the N−1th scan line, a first electrode coupled to the Vini line, and a second electrode coupled to the fourth node;
   a light emitting element including an anode coupled to the fourth node and a cathode coupled to the VSS line; and
   a capacitor coupled between the VDD line and the second node.

4. The display panel of claim 2, wherein:
   the second region further includes an REF line to which a reference voltage lower than the pixel driving voltage is applied, and a VSS line to which the low potential power supply voltage lower than the pixel driving voltage is applied during an active period every frame period; and
   the gate line of the first region includes a scan line to which a first scan pulse is applied in the active period and a second scan pulse is applied in a vertical blank period every frame period, and a reset line in which a reset pulse is applied in the vertical blank period.

5. The display panel of claim 4, wherein the reference voltage is set to the same voltage as the pixel driving voltage.

6. The display panel of claim 4, wherein the second pixel circuit includes:
   a driving element including a first electrode coupled to a first node, a gate electrode coupled to a second node, and a second electrode coupled to a third node;
   a first switch element including a gate electrode coupled to the scan line, a first electrode coupled to the data line of the second region, and a second electrode coupled to the first node;
   a second switch element including a gate electrode coupled to the reset line, a first electrode coupled to the second node, and a second electrode coupled to the first node;
   a third switch element including a gate electrode coupled to the reset line, a first electrode coupled to the REF line, and a second electrode coupled to the third node;
   a light emitting element including an anode coupled to the third node and a cathode coupled to the VSS line; and
   a capacitor coupled between the second node and the REF line.

7. The display panel of claim 1, wherein:
   each of the first and second pixel circuits includes a driving element configured to drive a light emitting element; and
   the driving element of the second pixel circuit has a larger channel ratio than the driving element of the first pixel circuit.

8. A display device comprising:
   a display panel including a first region where pixels are disposed, a second region where pixels having a lower pixel density compared to the first region are disposed, wherein the pixel density is pixels per inch;
   a first gate driving circuit configured to apply the gate signal to the gate lines of the first region;
   a second gate driving circuit configured to apply the gate signal to the gate lines of the second region;
   a first data driving circuit configured to supply a data voltage to data lines of the first region; and
   a second data driving circuit configured to supply a data voltage to data lines of the second region,
   wherein each of the pixels of the first region includes a first pixel circuit,
   each of the pixels of the second region includes a second pixel circuit, and
   the second pixel circuit includes fewer transistors compared to the first pixel circuit,
   wherein:

a pixel data of an input image is written to each of the pixels of the first region and the second region to display the input image in the first region and the second region, the data lines of the second region are separated from the data lines of the first region, and the gate lines of the second region are separated from the gate lines of the first region.

9. The display device of claim 8, wherein a voltage range of the data voltage output from the second data driving circuit is larger than a voltage range of the data voltage output from the first data driving circuit.

10. The display device of claim 9, wherein:

the first data driving circuit outputs a data voltage that a voltage decreases as a gray level increases; and the second data driving circuit outputs a data voltage that a voltage increases as the gray level increases.

11. The display device of claim 8, wherein the first and second gate driving circuits are disposed in a bezel region of the display panel.

12. The display device of claim 8, wherein:

the first gate driving circuit is disposed in a bezel region of the display panel; and at least a part of the second gate driving circuit is disposed in the second region.

13. The display device of claim 8, wherein:

each of the first and second pixel circuits includes a driving element configured to drive a light emitting element; and the driving element of the second pixel circuit has a larger channel ratio than the driving element of the first pixel circuit.

14. The display device of claim 13, wherein:

the channel ratio is set larger by either increasing a channel width or reducing a channel length of the driving element disposed in the second pixel circuit.

* * * * *